(12) United States Patent
Hirosaki et al.

(10) Patent No.: US 9,062,252 B2
(45) Date of Patent: *Jun. 23, 2015

(54) PHOSPHOR, MANUFACTURE THEREOF, LIGHT-EMITTING DEVICE, AND IMAGE DISPLAY DEVICE

(71) Applicants: Naoto Hirosaki, Ibaraki (JP); Takashi Takeda, Ibaraki (JP); Shiro Funahashi, Ibaraki (JP)

(72) Inventors: Naoto Hirosaki, Ibaraki (JP); Takashi Takeda, Ibaraki (JP); Shiro Funahashi, Ibaraki (JP)

(73) Assignee: National Institute For Materials Science, Tsukuba-shi (JP)

(*) Notice: Subject to any disclaimer, the term of this patent is extended or adjusted under 35 U.S.C. 154(b) by 159 days.

This patent is subject to a terminal disclaimer.

(21) Appl. No.: 13/690,340

(22) Filed: Nov. 30, 2012

(65) Prior Publication Data

US 2013/0207535 A1   Aug. 15, 2013

Related U.S. Application Data

(63) Continuation of application No. PCT/JP2012/078866, filed on Nov. 7, 2012.

(30) Foreign Application Priority Data

Nov. 7, 2011 (JP) ................................ 2011-243556

(51) Int. Cl.
*C09K 11/77* (2006.01)
*C09K 11/08* (2006.01)
(Continued)

(52) U.S. Cl.
CPC ......... *C09K 11/7786* (2013.01); *C09K 11/0883* (2013.01); *C09K 11/7734* (2013.01);
(Continued)

(58) Field of Classification Search
CPC ............... C09K 11/0883; C09K 11/57; C09K 11/7706; C09K 11/7721; C09K 11/7734; C09K 11/7749; C09K 11/7758; C09K 11/7764; C09K 11/7774; C09K 11/7792; H01L 33/502; H01L 33/504; H01J 1/63; H01J 29/187; H01J 29/20
USPC ...... 252/301.4 F; 257/98; 313/503, 582, 584, 313/467, 487
See application file for complete search history.

(56) References Cited

U.S. PATENT DOCUMENTS 7,544,309 B2 * 6/2009 Juestel et al. ........... 252/301.4 F
2006/0192178 A1 8/2006 Hirosaki
(Continued)

FOREIGN PATENT DOCUMENTS

JP   3668770 B   4/2005
JP   3837551 B   8/2006
(Continued)

*Primary Examiner* — Carol M Koslow
(74) *Attorney, Agent, or Firm* — Trojan Law Offices

(57) ABSTRACT

Provided is a chemically-thermally stable phosphor having different emission characteristics from the conventional and exhibiting high emission intensity with an LED of 470 nm or less. A phosphor of the present invention includes an inorganic crystal of a crystal represented by $Sr_1Si_3Al_2O_4N_4$, another inorganic crystal represented by $A_1(D,E)_5X_8$ and having the same crystal structure as $Sr_1Si_3Al_2O_4N_4$, and/or a solid-solution crystal thereof, all with M (one or more kinds of elements selected from Mn, Ce, Pr, Nd, Sm, Eu, Tb, Dy, and Yb) being solid-solved, wherein A is one or more kinds selected from Mg, Ca, Sr and Ba; D is one or more kinds selected from Si, Ge, Sn, Ti, Zr and Hf; E is one or more kinds selected from B, Al, Ga, In, Sc, Y and La; and X is one or more kinds selected from O, N and F.

51 Claims, 11 Drawing Sheets

(51) Int. Cl.
*H01J 61/44* (2006.01)
*H05B 33/14* (2006.01)
*H01J 1/63* (2006.01)
*H05B 33/12* (2006.01)
*H01L 33/50* (2010.01)

(52) U.S. Cl.
CPC ............... *H01J 61/44* (2013.01); *H05B 33/14* (2013.01); *H01L 33/502* (2013.01); *C09K 11/7703* (2013.01); *C09K 11/7718* (2013.01); *C09K 11/7731* (2013.01); *C09K 11/7746* (2013.01); *C09K 11/7761* (2013.01); *H01J 1/63* (2013.01); *H05B 33/12* (2013.01); *H01L 2224/48091* (2013.01); *H01L 2224/48247* (2013.01); *H01L 2224/73265* (2013.01); *H01L 2224/8592* (2013.01)

(56) References Cited

U.S. PATENT DOCUMENTS

| | | |
|---|---|---|
| 2007/0007494 A1 | 1/2007 | Hirosaki |
| 2007/0018567 A1 | 1/2007 | Hirosaki |
| 2007/0108896 A1 | 5/2007 | Hirosaki |
| 2009/0096361 A1 | 4/2009 | Fukuda |
| 2009/0236969 A1 | 9/2009 | Hirosaki |
| 2011/0057149 A1 | 3/2011 | Asai |
| 2011/0058582 A1 | 3/2011 | Asai |
| 2011/0058583 A1 | 3/2011 | Asai |
| 2011/0121234 A1 | 5/2011 | Hirosaki |
| 2012/0119234 A1 | 5/2012 | Hirosaki |

FOREIGN PATENT DOCUMENTS

| | | |
|---|---|---|
| JP | 2009-132916 A | 6/2009 |
| JP | 4524368 B | 6/2010 |

\* cited by examiner

<001>   <010>   <101>

Powder XRD pattern of SrO.5BaO.5Si3Al2N4O4 calculated from the single crystal structure Powder XRD pattern of example 2 (Actually measured)

Powder XRD pattern of example 7 (Actually measured)

Powder XRD pattern of example 8 (Actually measured)

Powder XRD pattern of example 9 (Actually measured)

Powder XRD pattern of example 25 (Actually measured)

Powder XRD pattern of example 26 (Actually measured)

Powder XRD pattern of example 32 (Actually measured)

Powder XRD pattern of example 36 (Actually measured)

Powder XRD pattern of example 41 (Actually measured)

Powder XRD pattern of example 46 (Actually measured)

Powder XRD pattern of example 52 (Actually measured)

Powder XRD pattern of example 56 (Actually measured)

Powder XRD pattern of example 57 (Actually measured)

PHOSPHOR, MANUFACTURE THEREOF, LIGHT-EMITTING DEVICE, AND IMAGE DISPLAY DEVICE

CROSS-REFERENCE TO RELATED APPLICATION

This application is a continuation of International Application No. PCT/JP2012/78866, filed on Nov. 7, 2012, the entire contents of which are incorporated herein by reference. This application also claims the benefit of priority from Japanese Patent Application No. 2011-243556 filed on Nov. 7, 2011, the entire contents of which are incorporated herein by reference.

TECHNICAL FIELD

The present invention relates to a phosphor, a manufacturing method thereof, and an application thereof, the phosphor comprising, as a host crystal, $Sr_1Si_3Al_2O_4N_4$ or a crystal having the same crystal structure thereof (hereinafter referred to as $Sr_1Si_3Al_2O_4N_4$ group crystal).

BACKGROUND ART

A phosphor is utilized in a fluorescent display tube (VFD: vacuum-fluorescent display), a field emission display (FED: Field Emission Display) or SED (Surface-Conduction Electron-Emitter Display), a plasma display panel (PDP: Plasma Display Panel), a cathode-ray tube (CRT: Cathode-Ray Tube), a liquid display backlight (Liquid-Crystal Display Backlight), a white light-emitting diode (LED: Light-Emitting Diode), and so on. In any of these applications, it is necessary to provide the phosphor with energy to excite the phosphor in order to make the phosphor emit fluorescence and the phosphor is excited by an excitation source with high energy such as a vacuum ultraviolet ray, an ultraviolet ray, an electron beam, and blue light so as to emit a visible light ray such as blue light, green light, yellow light, orange light, and red light. However, as a result of the phosphor being exposed to such excitation source, the luminance of the phosphor tends to decrease and a phosphor having little degradation in the brightness is desired. Therefore, a phosphor having an inorganic crystal containing nitrogen in a crystal structure thereof as a host crystal, instead of a phosphor such as a silicate phosphor, a phosphate phosphor, a aluminate phosphor, and a sulfide phosphor, has been proposed, as exemplified by a sialon phosphor, an oxynitride phosphor, or a nitride phosphor, which is characterized by low brightness deterioration caused by high energy excitation.

An example of the sialon phosphors is manufactured by a manufacturing process as generally described below. First, silicon nitride ($Si_3N_4$), aluminum nitride (AlN), and europium oxide ($Eu_2O_3$) are mixed in predetermined molar ratios and the resultant mixture is fired by a hot press method in one atmospheric pressure (0.1 MPa) of nitrogen atmosphere at 1700° C. for one hour. It was reported that α-sialon activated with an $Eu^{2+}$ ion manufactured by the above process had become a phosphor emitting light of a yellow color in a wavelength range of 550 nm to 600 nm if excited by blue light having a wavelength range of 450 to 500 nm. Further, it is known that an emission wavelength may vary as a ratio of Si to Al or a ratio of oxygen to nitrogen is changed while the α-sialon crystal structure is maintained.

As another example of the sialon phosphor, a green phosphor in which β type sialon (β-sialon) is activated by $Eu^{2+}$ is known (For example, refer to the specification of Japanese Patent No. 3921545. The document is incorporated herein by reference.). It is known that, in the phosphor, an emission wavelength thereof varies to a shorter wavelength by changing the oxygen content while the crystal structure remains the same. Moreover, it is known that a blue phosphor is to be formed when β-sialon is activated by $Ce^{3+}$ (For example, refer to WO 2006/101096 A. The document is incorporated herein by reference.).

As an example of an oxynitride phosphor, a blue phosphor having a JEM phase ($LaAl(Si_{6-z}Al_z)N_{10-z}O_z$) as a host crystal which is activated by Ce (For example, refer to WO 2005/019376 A. The document is incorporated herein by reference.) is known. It is known that, in the phosphor, an emission wavelength shifts to a longer wavelength as an excitation wavelength shifts to a longer wavelength by substituting partially La with Ca while the crystal structure is maintained.

As another example of the oxynitride phosphor, a blue phosphor having a La—N crystal $La_3Si_8N_{11}O_4$ as a host crystal, which is activated by Ce, is known (For example, refer to Japanese patent application publication No. 2005-112922 A. The document is incorporated herein by reference.).

As an example of a nitride phosphor, a red phosphor having $CaAlSiN_3$ as a host crystal, which is activated by $Eu^{2+}$ is known (For example, refer to Japanese patent No. 3837588 B. The document is incorporated herein by reference.). Color rendering properties of a white LED are improved effectively by utilizing this phosphor. It has been reported that a phosphor to which Ce is added as an optical activating-element becomes an orange phosphor.

Thus, an emission color of the phosphor is determined by a combination of the crystal to act as the host crystal and a metal ion (activating ion) being incorporated into the crystal. Further, the combination of the host crystal and the activating ion determines emission characteristics such as an emission spectrum and an excitation spectrum, chemical stability, and thermal stability such that a phosphor is regarded as another different phosphor when a host crystal thereof or an activating ion thereof is different. Moreover, a material having a different crystal structure is different in the emission characteristics or in the stability because the host crystal is different even if the material has the same chemical composition such that the material is regarded as another different phosphor.

Further, kinds of constituent elements can be substituted in many phosphors while the same crystal structure of the host crystal is maintained, thereby changing the emission color. For example, although a phosphor having a YAG crystal to which Ce is added emits light of a green color, a phosphor having a YAG crystal in which Y is partially substituted with Gd and Al is partially substituted with Ga exhibits emission of a yellow color. Further, in a phosphor having $CaAlSiN_3$ to which Eu is added, it is known that a composition thereof varies by partially substituting Ca with Sr while the same crystal structure is maintained such that the emission wavelength shifts to a shorter wavelength. In this way, such a phosphor in which element substitution is performed while the same crystal structure is maintained is regarded as a material of the same group.

SUMMARY OF THE INVENTION

From the described above, it is important to find a host crystal having a new crystal structure in developing a new phosphor and it is possible to propose a new phosphor by making the phosphor exhibit luminescence characteristics by activating the phosphor having such a host crystal with a metal ion to cause the emission.

The present invention aims to satisfy such demand and it is one of the objects to provide an inorganic phosphor that has emission characteristics (emission color, excitation characteristics, emission spectrum) different from those of a conventional phosphor, exhibits high emission intensity even when combined with an LED with a wavelength of 470 nm or less, and is chemically and thermally stable. It is another object of the present invention to provide a light-emitting unit that utilizes such a phosphor and is excellent in durability and an image display device that utilizes such a phosphor and is excellent in durability.

Under such a situation, the present inventors investigated in detail a phosphor having, as a host crystal, a new crystal containing nitrogen and a crystal in which a metal element or N in the crystal structure is substituted by another kind of element, so as to find out that an inorganic material having, as the host crystal, a crystal including a crystal structure of $Sr_1Si_3Al_2O_4N_4$ system crystal emits fluorescence of high brightness. Further, the present inventors found out that the inorganic material having a specific composition exhibits the emission in a blue color.

Moreover, although a specific crystal structure is represented by $Sr_1Si_3Al_2O_4N_4$ as one typical compound in the above description, the specific crystal structure is a crystal structure of a crystal or a system crystal represented by $A_1(D,E)_5X_8$ in general. Here, A may be at least one kind of element selected from Mg, Ca, Sr, and Ba, D may be at least one kind of element selected from Si, Ge, Sn, Ti, Zr, and Hf, E may be at least one kind of element selected from B, Al, Ga, In, Sc, Y, and La, and X may be at least one kind of element selected from O, N, and F.

In particular, the A element may comprise either or both of Sr and Ba, the D element may comprise Si, the E element may comprise Al, and the X element may comprise N and may further comprise O if necessary. The above-described crystal structure can be formed by combining the elements described here as appropriate. For example, it is preferable to provide a crystal or crystal system that can be represented by $(Sr,Ba)_1(Si,Al)_5(O,N)_8$. Here, $(Sr, Ba)_1$ represents a molar ratio of 1:13 (5+8=13) in the total molar fraction and the one (1) mole is constituted of Sr and Ba. For example, $(Sr, Ba)_1$ may include "$Sr_{0.5}Ba_{0.5}$", "$Sr_0Ba_1$", and "$Sr_1Ba_0$."

In a similar manner, $(Si,Al)_5$ represents a molar ratio of 5:9 (1+8=9) in the total molar fraction and the five (5) mole is constituted of Si and Al. For example, $(Si, Al)_5$ may include "$Si_fAl_g$" (0<f<5, 0<g<5, and f+g=5) such as "$Si_2Al_3$" and "$Si_3Al_2$". In a similar manner, $(O,N)_8$ represents a molar ratio of 8:6 (1+5=6) in the total molar fraction and the eight (8) mole is constituted of O and N. For example, $(O, N)_8$ may include "$O_{h1}N_{h2}$" (0≤h1<8, 0<h2<8, and h1+h2=8) such as "$O_4N_4$". However, it is preferable to satisfy: $2+4xf+3xg=2xh1+3xh2$ in order to keep the charge neutrality within the compound.

Further, it was found to be possible to obtain a white color light-emitting diode (light-emitting unit) with a high emission efficiency and a small temperature fluctuation, an illuminating device with the same diode, and an image display device rendering bright coloring by utilizing such phosphor.

The present inventors conducted intensive researches in consideration of the above-mentioned circumstances so as to successfully provide a phosphor rendering emission with a high intensity of a specific wavelength region by implementing the configuration recited in the following. Further, a phosphor having excellent emission characteristics was successfully manufactured by employing a method to be described later. Further, a light-emitting unit, an illuminating device, an image display device, and pigment, ultraviolet absorber having excellent features were successfully provided by implementing the configuration recited in the following. More specifically, the following is provided.

(1) A phosphor comprising: an inorganic compound comprising: an inorganic crystal constituted of a crystal represented by $Sr_1Si_3Al_2O_4N_4$ with an M element being solid-solved into the inorganic crystal (wherein M is one or more kinds of elements selected from a group consisting of Mn, Ce, Pr, Nd, Sm, Eu, Tb, Dy, and Yb); and/or another inorganic crystal, which is represented by $A_1(D,E)_5X_8$ and which has a same crystal structure as the crystal represented by the $Sr_1Si_3Al_2O_4N_4$ and with the M element being solid-solved into the another inorganic crystal (wherein A is one or more kinds of elements selected from the group consisting of Mg, Ca, Sr, and Ba, D is one or more kinds of elements selected from the group consisting of Si, Ge, Sn, Ti, Zr, and Hf, E is one or more kinds of elements selected from the group consisting of B, Al, Ga, In, Sc, Y, and La, and X is one or more kinds of elements selected from the group consisting of O, N, and F); and/or a solid-solution crystal of the inorganic crystal or the another inorganic crystal.

Here, the identical crystal structure may include a structure to be substantially identical thereto, and also a so-called similar structure thereof. Therefore, the crystal may be said to have the identical structure even if lattice constants thereof are longer or shorter.

In general, a solid solution body means what is constituted of a uniform solid in which one kind of solid is solved into another kind of solid, and solid solution means that the solid becomes in such a state or is in such a state. For example, a state in which, even if another kind of atom enters into a crystal structure of an inorganic compound, the other kind of atom is mixed therein in a solid state while the original crystal structure remains the same may be referred to as the solid-solution, and the body itself in such a state can be referred to as the solid solution body. As more specific examples, the solid solution body includes a substitutional solid solution body and an interstitial solid solution body.

In the substitutional solid solution body, a solvent atom is substituted with a solute atom, and the substitution is likely to occur in case respective atoms are approximately in the same size. It is considered that the complete solid solution may occur over all range of constituent ratio thereof if difference in atomic radii of the respective atoms is up to about 10%, but that the solid solubility is sharply decreased if the difference is more than this, and it is said that the solid solution would not occur if the difference is equal to or more than 15%. This empirical rule is made to be one of the Hume-Rothery's rules. In the interstitial solid solution body, an element having a relatively small atomic radius is supposed to enter into an interstice between atoms of a crystal lattice. The solid solution body described herein may be either or both of them.

In addition, in the case of solid-solution, it is preferable to maintain the charge neutrality as a whole. However, an electron and/or a positive hole may be occasionally generated at least partially in the crystal structure such that the charge neutrality is not necessarily to be achieved only with respect to the element constituting the crystal structure.

(2) The phosphor according to the above (1), wherein the other inorganic crystal having the crystal structure identical to the crystal structure of the crystal represented by $Sr_1Si_3Al_2O_4N_4$ is a crystal represented by $A_1Si_3Al_2O_4N_4$ or $A_1(D,E)_5X_8$.

(3) The phosphor according to the above (1) or (2), wherein the A element includes either or both of Sr and Ba, the D element includes Si, the E element includes Al, X element includes N, and the X element includes O if necessary.

(4) The phosphor according to any one of the above (1) to (3), wherein the M element includes Eu.

(5) The phosphor according to any one of the above (1) to (4), wherein the inorganic crystal is a crystal in a monoclinic system.

(6) The phosphor according to any one of the above (1) to (5), wherein the inorganic crystal is a crystal in a monoclinic system and has a symmetry in a space group $P2_1$, and lattice constants a, b and c have values in the ranges:

$a=0.72516\pm 0.05$ nm;

$b=0.93431\pm 0.05$ nm; and $c=1.08761\pm 0.05$ nm (wherein the above-described "±0.05" is a tolerance).

(7) The phosphor according to any one of the above (1) to (6), wherein the other inorganic crystal having a crystal structure identical to a crystal structure of the crystal represented by $Sr_1Si_3Al_2O_4N_4$ is $Ba_1Si_3Al_2O_4N_4$ or $(Sr,Ba)_1Si_3Al_2O_4N_4$.

(8) The phosphor according to any one of the above (1) to (7), wherein the other inorganic crystal having a crystal structure identical to a crystal structure of the crystal represented by $Sr_1Si_3Al_2O_4N_4$ is represented by a composition formula:

$(Sr,Ba)_1Si_{3-x}Al_{2+x}O_{4+x}N_{4-x}$ (wherein $-1\le x\le 2$).

(9) The phosphor according to any one of the above (1) to (8), wherein the inorganic compound consists of a crystal represented by:

$A_1Si_{3-x}Al_{2+x}O_{4+x}N_{4-x}$, wherein $-1\le x\le 2$, and Eu is solid-solved therein.

(10) The phosphor according to any one of the above (1) to (9), wherein the A element is a combination of Sr and Ba.

(11) The phosphor according to any one of the above (1) to (10), wherein the inorganic crystal is represented, as parameters x and y are used, by:

$Eu_y(Sr,Ba)_1Si_{3-x}Al_{2+x}O_{4+x}N_{4-x}$ (wherein $-1\le x\le 2$, and $0.0001\le y\le 0.5$).

(12) The phosphor according to any one of the above (8) or (11), wherein the x is equal to 0.

(13) The phosphor according to the above (9) or (11), wherein the A element is a combination of Sr and Ba, the x is equal to 0, and fluorescence of a blue color having 440 nm or more to 520 nm or less is emitted upon irradiation of light having 295 to 420 nm.

(14) The phosphor according to any one of the above (1) to (13), wherein the inorganic compound includes a single crystal particle or an aggregate thereof having a mean particle diameter of 0.1 μm or more to 20 μm or less.

(15) The phosphor according to any one from the above (1) to (14), wherein a sum of Fe, Co, and Ni impurity elements does not exceed 500 ppm.

(16) The phosphor according to any one from the above (1) to (15), further comprising an amorphous phase or a crystal phase that is different from the inorganic compound in addition to the inorganic compound, wherein a content amount of the inorganic compound is equal to or more than 20 mass %.

(17) The phosphor according to the above (16), wherein the amorphous phase or the crystal phase that is different from the inorganic compound is an inorganic substance having electronic conductivity.

(18) The phosphor according to the above (17), wherein the inorganic substance having the electrical conductivity is oxide, oxynitride, nitride, or a combination thereof, any one of which includes one or two or more kinds of elements selected from Zn, Al, Ga, In, and Sn.

(19) The phosphor according to any one of the above (16) to (18), wherein the amorphous phase or the crystal phase that is different from the inorganic compound is another phosphor.

(20) The phosphor according to any one of the above (1) to (19), wherein the phosphor emits fluorescent having a peak in a wavelength range of 440 nm to 520 nm upon irradiation of an excitation source.

(21) The phosphor according to any one of the above (1) to (20), wherein the excitation source is a vacuum ultraviolet ray, an ultraviolet ray or visible light, each of which has a wavelength that is in each specific range among from 100 nm 420 nm, or an electron beam or an X-ray.

(22) The phosphor according to any one of the above (1) to (21), wherein a color of light emitted upon irradiation of an excitation source satisfies, in terms of values of (x, y) of CIE 1931 chromaticity coordinates, conditions:

$0.05\le x\le 0.3$; and $0.02\le y\le 0.4$.

(23) The phosphor according to any one of the above (1) to (22), wherein the inorganic compound is represented by a composition formula of $M_dA_eD_fE_gX_h$ (wherein, d+e+f+g+h=1 in the formula; M is one or two or more kinds of elements selected from Mn, Ce, Pr, Nd, Sm, Eu, Tb, Dy, and Yb; A is one or two or more kinds of elements selected from Mg, Ca, Sr, and Ba; D is one or two or more kinds of elements selected from Si, Ge, Sn, Ti, Zr, and Hf, E is one or two or more kinds of elements selected from B, Al, Ga, In, Sc, Y, and La; and X is one or two or more kinds of elements selected from O, N, and F), and represented by a composition within the range wherein parameters d, e, f, g, and h satisfy all conditions:

$0.00001\le d\le 0.05$;

$0.05\le e\le 0.1$;

$0.07\le f\le 0.3$;

$0.07\le g\le 0.3$; and $0.45\le h\le 0.6$.

(24) The phosphor according to the above (23), comprising the inorganic compound satisfying a relationship of: $0.5/5\le (d+e)/(f+g)\le 2/5$ in the composition formula.

(25) The phosphor according to the above (24), comprising the inorganic compound satisfying a relationship of: $0.9/5\le (d+e)/(f+g)\le 1.2/5$ in the composition formula.

(26) The phosphor according to any one of the above (23) to (25), wherein values of the parameters d, e, f, g, and h of the composition formula are within a range satisfy all conditions of:

$0.06\le d+e\le (1/14)+0.05$;

$(5/14)-0.05\le f+g\le (5/14)+0.05$; and $(8/14)-0.05\le h\le 0.6$.

(27) The phosphor according to any one of the above (23) to (25), comprising the inorganic compound having the composition formula in which the parameters f and g satisfy a condition of:

$2/5\le f/(f+g)\le 4/5$.

(28) The phosphor according to any one of the above (23) to (25), comprising the inorganic compound having a composition formula of $M_dA_eD_fE_gO_{h1}N_{h2}$ (here, d+e+f+g+h1+h2=1 and h1+h2=h in the formula), wherein the X element includes N and O and a condition of:

$$2/8 \le h1/(h1+h2) \le 6/8$$

is satisfied.

(29) The phosphor according to the above (28), comprising the inorganic compound satisfying a condition of:

$$3.5/8 \le h1/(h1+h2) \le 4.5/8$$

in the composition formula.

(30) A method of manufacturing a phosphor comprising: firing a raw material mixture of metal compounds, which can constitute the phosphor according to any one of the above (1) to (29) by firing the mixture, in a temperature range of 1,200° C. or higher to 2,200° C. or lower in an inert atmosphere including nitrogen.

(31) The method of manufacturing the phosphor according to the above (30), wherein the mixture of metal compounds comprises a compound including M, a compound including A, a compound including D, a compound including E, and a compound including X (wherein M is one or two or more kinds of elements selected from Mn, Ce, Pr, Nd, Sm, Eu, Tb, Dy, and Yb; A is one or two or more kinds of elements selected from Mg, Ca, Sr, and Ba; D is one or two or more kinds of elements selected from Si, Ge, Sn, Ti, Zr, and Hf; E is one or two or more kinds of elements selected from B, Al, Ga, In, Sc, Y, and La; and X is one or two or more kinds of elements selected from O, N, and F).

(32) The method of manufacturing the phosphor according to the above (31), wherein the compound including M is a single kind of substance or a mixture of at least two kinds of substances selected from metal, silicide, oxide, carbonate, nitride, oxynitride, chloride, and fluoride or oxyfluoride, each of which includes M; the compound including A is a single kind of substance or a mixture of at least two kinds of substances selected from metal, silicide, oxide, carbonate, nitride, oxynitride, chloride, and fluoride or oxyfluoride, each of which includes A; and the compound including D is a single kind of substance or a mixture of at least two kinds of substances selected from metal, silicide, oxide, carbonate, nitride, oxynitride, chloride, and fluoride or oxyfluoride, each of which includes D.

(33) The method of manufacturing the phosphor according to any one of the above (30) to (32), wherein the mixture of metal compounds includes at least nitride or oxide of europium; nitride, oxide, or carbonate of strontium and/or nitride, oxide, or carbonate of barium; silicon oxide or silicon nitride; and aluminum oxide or aluminum nitride.

(34) The method of manufacturing the phosphor according to any one of the above (30) to (33), wherein the inert atmosphere including nitrogen is a nitrogen gas atmosphere in a pressure range of 0.1 MPa or higher to 100 MPa or lower.

(35) The method of manufacturing the phosphor according to any one of the above (30) to (34), wherein graphite is used for a heating element, a heat-insulating element, or a sample container of a firing furnace.

(36) The method of manufacturing the phosphor according to any one of the above (30) to (35), wherein the step of firing is performed after the metal compounds in a form of powder or aggregate are filled in a container as being maintained at a filling rate of 40% or less in a bulk density.

(37) The method of manufacturing the phosphor according to any one of the above (30) to (36), wherein a container used for the step of firing is made of boron nitride.

(38) The method of manufacturing the phosphor according to any one of the above (30) to (37), wherein a mean particle diameter of powder particles or aggregates of the metal compounds is 500 μm or less.

(39) The method of manufacturing the phosphor according to any one of the above (30) to (38), wherein a mean particle diameter of aggregates of the metal compounds is controlled to be 500 μm or less by means of a spray dryer, sieving or pneumatic classification.

(40) The method of manufacturing the phosphor according to any one of the above (30) to (39), wherein the step of firing is characterized as pressureless sintering or gas-pressure sintering.

(41) The method of manufacturing the phosphor according to any one of the above (30) to (40), wherein a mean particle diameter of phosphor powder synthesized by firing is controlled to be 50 nm or more and 200 μm or less by at least one technique selected from pulverization, classification, and acid treatment.

(42) The method of manufacturing the phosphor according to any one of the above (30) to (41), wherein a phosphor powder after firing, a phosphor powder after pulverization treatment, or a phosphor powder after particle size adjustment is heat-treated at a temperature that is equal to or higher than 1,000° C. and equal to or lower than a firing temperature.

(43) The method of manufacturing the phosphor according to any one of the above (30) to (42), wherein another inorganic compound to produce a liquid phase at a temperature equal to or less than the firing temperature is added to the mixture of metal compounds, which is then fired in the firing step.

(44) The method of manufacturing the phosphor according to the above (43), wherein the other inorganic compound to produce the liquid phase at the temperature equal to or less than the firing temperature is a mixture of one or more kinds of substances selected from fluoride, chloride, iodide, bromide, and phosphate of one or more elements selected from Li, Na, K, Mg, Ca, Sr, and Ba.

(45) The method of manufacturing the phosphor according to the above (43), wherein a content amount of the other inorganic compound to produce the liquid phase at the temperature equal to or less than the firing temperature is reduced by washing with a solvent after the step of firing.

(46) A light-emitting unit comprising a light-emitting body and a first phosphor, wherein the first phosphor is the phosphor recited in any one of the above (1) to (29).

(47) The light-emitting unit according to the above (46), wherein the light-emitting body is an organic EL light-emitting body (OLED), a semiconductor laser, a laser diode (LD), or a light-emitting diode (LED) emitting light of a wavelength of 330 to 500 nm.

(48) The light-emitting unit according to the above (46) or (47), wherein the light-emitting unit is a white light-emitting diode, an illuminating device including a plurality of white light-emitting diodes, or a backlight for a liquid crystal panel.

(49) The light-emitting unit according to any one of the above (46) to (48), further comprising a second phosphor, wherein the light-emitting body emits ultraviolet or visible light having a peak wavelength of 300 to 420 nm, and the light-emitting unit emits white light or light other than the white light by mixing blue light emitted from the first phosphor and light having a wavelength of 470 nm or more emitted from the second phosphor.

(50) The light-emitting unit according to any one of the above (46) to (48), further comprising a blue phosphor being caused to emit light having a peak wavelength of 420 nm to 500 nm or less by the light-emitting body.

(51) The light-emitting unit according to the above (50), wherein the blue phosphor is selected from AlN:(Eu, Si), BaMgAl$_{10}$O$_{17}$:Eu, SrSi$_9$AL$_{19}$ON$_{31}$:Eu, LaSi$_9$Al$_{19}$N$_{32}$:Eu, α-sialon:Ce, and JEM:Ce.

(52) The light-emitting unit according to any one of the above (46) to (51), further comprising a green phosphor being caused to emit light having a peak wavelength of 500 nm or more to 550 nm or less by the light-emitting body.

(53) The light-emitting unit according to the above (52), wherein the green phosphor is selected from β-sialon:Eu, (Ba, Sr, Ca, Mg)$_2$SiO$_4$:Eu, and (Ca, Sr, Ba)Si$_2$O$_2$N$_2$:Eu.

(54) The light-emitting unit according to any one of the above (46) to (53), further comprising a yellow phosphor being caused to emit light having a peak wavelength of 550 nm or more to 600 nm or less by the light-emitting body.

(55) The light-emitting unit according to the above (54), wherein the yellow phosphor is selected from YAG:Ce, α-sialon:Eu, CaAlSiN$_3$:Ce, and La$_3$Si$_6$N$_{11}$:Ce.

(56) The light-emitting unit according to any one of the above (46) to (55), further comprising a red phosphor being caused to emit light having a peak wavelength of 600 nm or more to 700 nm or less by the light-emitting body.

(57) The light-emitting unit according to the above (56), wherein the red phosphor is selected from CaAlSiN$_3$:Eu, (Ca, Sr)AlSiN$_3$:Eu, Ca$_2$Si$_5$N$_8$:Eu, and Sr$_2$Si$_5$N$_8$:Eu.

(58) The light-emitting unit according to any one of the above (46) to (57), wherein the light-emitting body is an LED for emitting light having a wavelength of 320 to 420 nm.

(59) An image display device comprising: an excitation source and a phosphor, wherein the phosphor comprises at least the phosphor recited in any one of the above (1) to (29).

(60) The image display device according to the above (59), wherein the image display device is a fluorescent display tube (VFD), a field emission display (FED), a plasma display panel (PDP), a cathode-ray tube (CRT), or a liquid crystal display (LCD).

(61) A pigment comprising the phosphor recited in any one of the above (1) to (29).

(62) An ultraviolet absorber comprising the phosphor recited in any one of the above (1) to (29).

The phosphor of the present invention includes, as a main component, a multinary oxynitride including a divalent element, a trivalent element, and a tetravalent element, in particular, a crystal represented by Sr$_1$Si$_3$Al$_2$O$_4$N$_4$ or a Sr$_1$Si$_3$Al$_2$O$_4$N$_4$ system crystal, i.e., another crystal having the identical crystal structure thereto so as to exhibit emission of brightness higher than that of a conventional oxide phosphor or oxynitride phosphor and the phosphor with a specific composition is excellent as a blue color phosphor. Since the brightness of the phosphor does not decrease even when exposed to the excitation source, the present invention provides a useful phosphor suitably used for the light-emitting unit such as the white light-emitting diode, the illuminating device, a backlight source for a liquid crystal, VFD, FED, PDP or CRT. Further, the phosphor absorbs ultraviolet light, and thus the phosphor is suitable for a pigment and ultraviolet absorber.

DETAILED DESCRIPTION OF THE EMBODIMENTS

Hereafter, a phosphor of the present invention is described in detail with reference to the drawings. A phosphor comprises: an inorganic compound comprising: an inorganic crystal constituted of a crystal represented by Sr$_1$Si$_3$Al$_2$O$_4$N$_4$, with an M element being solid-solved into the inorganic crystal; and/or another inorganic crystal represented by A$_1$(D,E)$_5$X$_8$, having a same crystal structure as the crystal represented by the Sr$_1$Si$_3$Al$_2$O$_4$N$_4$, and having an M element being solid-solved into the inorganic crystal; and/or a solid-solution crystal of the inorganic crystal or the another inorganic crystal. Here, M is one or more kinds of elements selected from the group consisting of Mn, Ce, Pr, Nd, Sm, Eu, Tb, Dy, and Yb; A is one or more kinds of elements selected from the group consisting of Mg, Ca, Sr, and Ba; D is one or more kinds of elements selected from the group consisting of Si, Ge, Sn, Ti, Zr, and Hf; E is one or more kinds of elements selected from the group consisting of B, Al, Ga, In, Sc, Y, and La; and X is one or more kinds of elements selected from the group consisting of O, N, and F. A phosphor having any of these inorganic crystals as a host crystal in particular exhibits high brightness.

The crystal represented by $Sr_1Si_3Al_2O_4N_4$, which was newly synthesized and confirmed to be a new crystal through the crystal structure analysis by the present inventors, is a crystal which has not been reported prior to the present invention.

Figure 1:
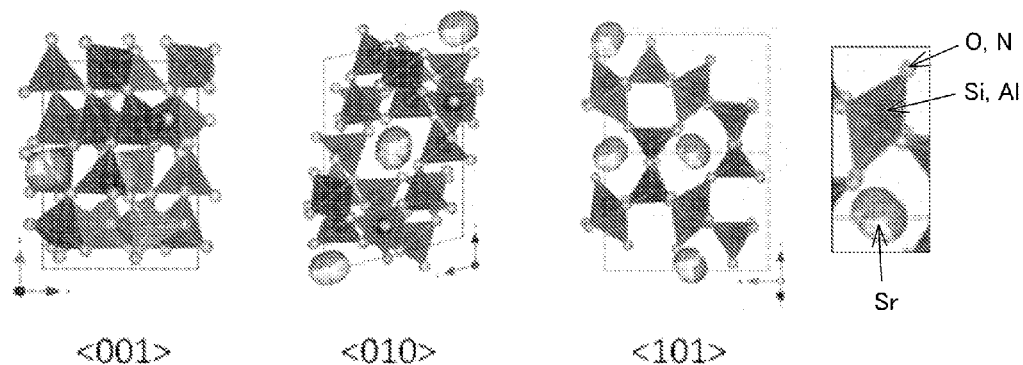
FIG. 1 is a diagram illustrating a crystal structure of Sr$_1$Si$_3$Al$_2$O$_4$N$_4$ crystal.

FIG. 1 is a diagram showing a crystal structure of $Sr_1Si_3Al_2O_4N_4$ crystal.

According to the single crystal structure analysis performed with respect to the $Sr_1Si_3Al_2O_4N_4$ crystal synthesized by the present inventors as an exemplary inorganic crystal constituted of a crystal represented by $Sr_1Si_3Al_2O_4N_4$, the $Sr_1Si_3Al_2O_4N_4$ crystal belongs to the monoclinic system and the $P2_1$ space group (space group No. 4 in the International Tables for Crystallography), and has crystal parameters and occupancy of the atomic coordinate positions as shown in Table 1.

In Table 1, lattice constants a, b, and c signify respective lengths of the axes of the unit cell, and α, β, and γ signify respective angles between axes of the unit cell. The atomic coordinates indicate a position of each atom in the unit cell in terms of a value between 0 and 1 using the unit cell as a unit. According to the analysis results thus obtained, there were atoms of Sr, Si, Al, O, and N, respectively, there were four kinds of sites: (Sr(1A), Sr(1B), Sr(2A), Sr(2B)) for Sr, Sr(1) occupied a site of Sr(1A) with an occupancy rate of 61.3% and a site of Sr(1B) with an occupancy rate of 38.7%, and Sr(2) occupied a site of Sr(2A) with an occupancy rate of 66.9% and a site of Sr(2B) with an occupancy rate of 33.1%. Also, analysis results that Si and Al occupied ten (10) kinds of sites of SiAl(1) to SiAl(10) without any distinction in the kind were obtained. Further, analysis results that O and N occupied sixteen (16) kinds of sites of NO(1) to NO(16) without any distinction in the kind were obtained.

TABLE 1

Crystal structure data of $Sr_1Si_3Al_2O_4N_4$ crystal
Crystal structure data of Sr1Si3Al2O4N4 crystal

| Crystal | | $Sr_1Si_3Al_2O_4N_4$ | |
|---|---|---|---|
| Formula weight (Z) | | 4 | |
| Crystal system | | Monoclinic | |
| Space group | | P2_1 | |
| Space group number | | 4 | |
| Lattice constants | a | 7.2516 Å | |
| | b | 9.3431 Å | |
| | c | 10.8761 Å | |
| | α | 90 degree | |
| | β | 104.489 degree | |
| | γ | 90 degree | |

| Atom | Atomic coordinate | | | Site occupancy rate |
|---|---|---|---|---|
| | x | y | z | |
| Sr (1A) | 1.0049 | 0.4644 | −0.0143 | 0.613 |
| Sr (1B) | 1.0559 | 0.4886 | −0.0154 | 0.387 |
| Sr (2A) | 0.5055 | 0.4444 | 0.5126 | 0.669 |
| Sr (2B) | 0.5116 | 0.4722 | 0.475 | 0.331 |
| Si, Al (1) | 0.6257 | 0.6961 | −0.0435 | 1 |
| Si, Al (2) | 0.8847 | 0.6943 | 0.2068 | 1 |
| Si, Al (3) | 1.129 | 0.6926 | 0.4565 | 1 |
| Si, Al (4) | 0.5795 | 0.9187 | 0.1449 | 1 |
| Si, Al (5) | 0.9481 | 0.9738 | 0.3496 | 1 |
| Si, Al (6) | 0.6272 | 0.1944 | 0.2908 | 1 |
| Si, Al (7) | 0.5724 | 0.4698 | 0.1417 | 1 |

TABLE 1-continued

Crystal structure data of $Sr_1Si_3Al_2O_4N_4$ crystal
Crystal structure data of Sr1Si3Al2O4N4 crystal

| Si, Al (8) | 0.3109 | 0.7018 | 0.2343 | 1 |
|---|---|---|---|---|
| Si, Al (9) | 0.9222 | 0.4218 | 0.3638 | 1 |
| Si, Al (10) | 0.7963 | 0.7148 | −0.269 | 1 |
| N, O (1) | 0.5602 | 0.7119 | −0.3548 | 1 |
| N, O (2) | 1.3199 | 0.6912 | 0.3931 | 1 |
| N, O (3) | 1.079 | 0.7087 | 0.1475 | 1 |
| N, O (4) | 0.9407 | 0.6069 | 0.3526 | 1 |
| N, O (5) | 0.811 | 0.7246 | −0.1098 | 1 |
| N, O (6) | 0.4428 | 0.6045 | −0.146 | 1 |
| N, O (7) | 0.722 | 0.5953 | 0.0931 | 1 |
| N, O (8) | 0.795 | 0.097 | 0.4016 | 1 |
| N, O (9) | 0.4329 | 0.852 | 0.2215 | 1 |
| N, O (10) | 0.8905 | 0.854 | −0.327 | 1 |
| N, O (11) | 0.8145 | 0.8691 | 0.2235 | 1 |
| N, O (12) | 1.0767 | 0.8712 | 0.4807 | 1 |
| N, O (13) | 0.5465 | 0.8644 | −0.0119 | 1 |
| N, O (14) | 1.1084 | 1.0599 | 0.2889 | 1 |
| N, O (15) | 0.7037 | 0.3652 | 0.2672 | 1 |
| N, O (16) | 0.4013 | 0.55 | 0.1885 | 1 |

As a result of analysis using data in Table 1, the $Sr_1Si_3Al_2O_4N_4$ crystal was found to have the structure as shown in FIG. 1, in which a Sr element is included in a skeleton formed by linking tetrahedrons constituted of bonds of Si or Al with O or N. The M element to become an activating ion such as Eu in the crystal is incorporated into the crystal in the type of partial substitution of the Sr element.

A crystal having a crystal structure identical to the crystal structure of $Sr_1Si_3Al_2O_4N_4$ crystal, which was synthesized and subjected to the structure analysis, includes an $A_1Si_3Al_2O_4N_4$ crystal and a crystal represented by $A_1(D, E)_5X_8$. The A element is typically Ba or a mixture of Sr and Ba. The X element is typically a mixture of O and N. In an $A_1(Si, Al)_5(O, N)_8$ crystal, Si and Al can occupy sites which Si and Al are supposed to occupy without distinguishing the sites mutually, and O and N can occupy sites which O and N are supposed to occupy without distinguishing the sites mutually. Thus, a relative ratio of numbers of atoms can be adjusted to 1 for the A element, 5 for the sum of Si and Al, and 8 for the sum of O and N while the crystal structure remains the same. However, it is desirable to have a ratio of Si/Al and a ratio of O/N so as to satisfy a condition of the electrical neutrality in the crystal.

The $Sr_1Si_3Al_2O_4N_4$ system crystal of the present invention can be identified by means of the X-ray diffraction or the neutron diffraction. A substance exhibiting the identical diffraction to that of the $Sr_1Si_3Al_2O_4N_4$ system crystal as a result of the X-ray diffraction in the present invention includes a crystal represented by $A_1(D,E)_5X_8$. Further, the substance includes a crystal in which lattice constants or atomic positions are changed by substituting other elements for constituent elements in the $Sr_1Si_3Al_2O_4N_4$ crystal. Here, specific examples of materials in which the constituent elements are substituted with other elements include a material in which Sr in the $Sr_1Si_3Al_2O_4N_4$ crystal is partially or completely substituted with the A element other than Sr (here, A is one or two or more kinds of elements selected from Mg, Ca, Sr, and Ba) or the M element (here, M is one or two or more kinds of elements selected from Mn, Ce, Pr, Nd, Sm, Eu, Tb, Dy, and Yb). Further, the specific examples include a material in which Si in the crystal is partially or completely substituted with the D element other than Si (here, D is one or two or more kinds of elements selected from Si, Ge, Sn, Ti, Zr, and Hf). Further, the specific examples include a material in which Al in the crystal is partially or completely substituted with the E element other than Al (here, E is one or two or more kinds of elements selected from B, Al, Ga, In, Sc, Y, and La). Further, the specific examples include a material in which O or N in the crystal is partially or completely substituted with fluorine. These substitutions are performed such that neutrality of charges in the whole crystal is maintained. A material in which a crystal structure thereof is not changed as a result of such element substitutions is included in the $Sr_1Si_3Al_2O_4N_4$ system crystal. Since emission characteristics, chemical stability, and thermal stability of the phosphor are changed by the substitution of elements, the substitution of elements may be selectively utilized at an appropriate time for each application thereof as far as the crystal structure remains the same.

In the $Sr_1Si_3Al_2O_4N_4$ system crystal, the lattice constants change as the constituent components are substituted with other elements or as an activating element such as Eu is solid-solved therein, but the atomic positions given by the crystal structure, sites to be occupied by atoms, and coordinates thereof do not significantly change to an extent in which a chemical bond between skeleton atoms is broken. In the present invention, a crystal structure is defined to be identical to that of the $Sr_1Si_3Al_2O_4N_4$ crystal if lengths of chemical bonds (distance of neighboring atoms) of Al—N and Si—N calculated from the lattice constants and atomic coordinates obtained by conducting Rietveld analysis of the results from the X-ray diffraction or the neutron diffraction in the space group of $P2_1$ are compared with lengths of chemical bonds calculated from the lattice constants and atomic coordinates of the $Sr_1Si_3Al_2O_4N_4$ crystal as shown in Table 1 such that the difference between the lengths is within ±5%, and using the definition it is determined whether the crystal having the crystal structure belongs to the $Sr_1Si_3Al_2O_4N_4$ system crystal or not. This determination criterion is employed herein since it was once observed that a crystal in the $Sr_1Si_3Al_2O_4N_4$ system crystal was changed to become another crystal due to breakage of chemical bonds when lengths of the chemical bonds were changed beyond ±5% according to the prior experiments and it was found that the determination criterion could be applied as the standard. Accordingly, the scope of the $Sr_1Si_3Al_2O_4N_4$ system crystal could be made within a range where the crystal would not be changed to become another crystal due to breakage of the chemical bonds, but it is also possible to set such a criterion utilizing numerical values.

Further, in case an amount of solid-solution is small, a simple method for determining whether it belongs to the $Sr_1Si_3Al_2O_4N_4$ system crystal or not is described as follows. A new substance can be identified to have the same crystal structure if main peaks of the resultant X-ray diffraction pattern measured with the new substance are respectively located at diffraction peak positions, which agree with the peak positions (2θ) of the diffraction pattern calculated using the crystal structure data of Table 1 and the lattice constants calculated from the resultant X-ray diffraction pattern.

Figure 2:
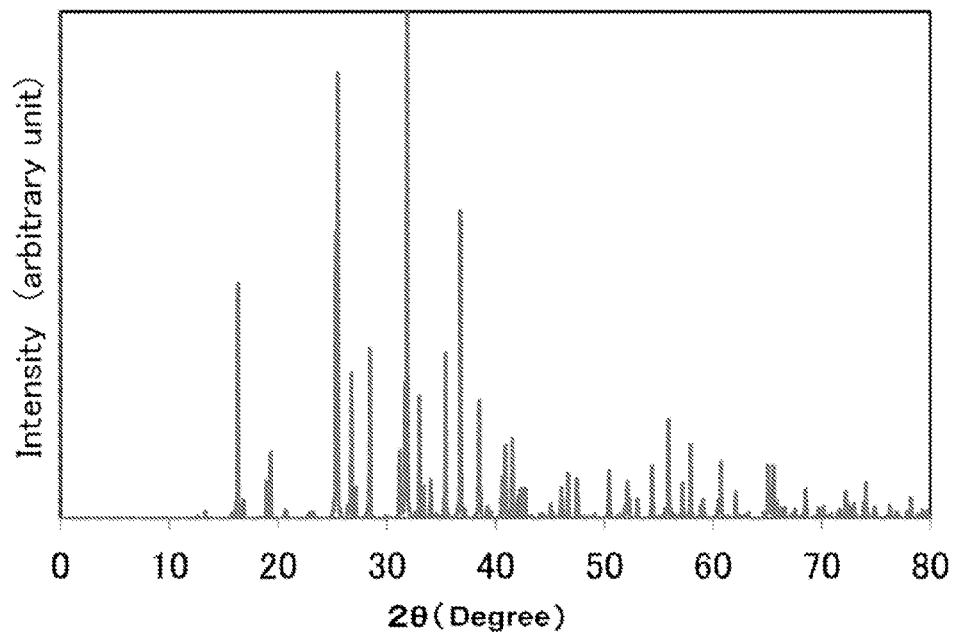
FIG. 2 is a diagram showing a powder X-ray diffraction patter using Cu Kα-line, calculated from a crystal structure of Sr$_1$Si$_3$Al$_2$O$_4$N$_4$ crystal.

FIG. 2 is a diagram showing a powder X-ray diffraction pattern using Cu Kα-line calculated from the crystal structure of the $Sr_1Si_3Al_2O_4N_4$ system crystal.

A simple judgment whether a substance belongs to the $Sr_1Si_3Al_2O_4N_4$ system crystal or not can be made by comparing an X-ray diffraction pattern of the substance to be compared with the pattern of FIG. 2. It may be good to make a judgment using approximately ten (10) peaks of the highest intensity in the diffraction pattern as the main peaks of the $Sr_1Si_3Al_2O_4N_4$ system crystal. Table 1 is important in this sense since it could be referenced when the identification of the $Sr_1Si_3Al_2O_4N_4$ system crystal is conducted. Further, it is also possible to define a crystal structure of the $Sr_1Si_3Al_2O_4N_4$ system crystal as an approximate structure using another crystal system of the monoclinic crystal and, in such a case, the crystal structure is expressed using a different space group, different lattice constants, and different plane indices, but the X-ray diffraction results (for example, FIG. 2) and the crystal structure (for example, FIG. 1) remain unchanged such that an identification method and an identification result thereof are the same. Therefore, in the present invention, it is to perform an X-ray diffraction analysis using the monoclinic system. The method of identifying the substance based on Table 1 will be concretely described in Examples to be described later, and the explanation of the method described herein is just in general.

A phosphor can be obtained if the $Sr_1Si_3Al_2O_4N_4$ system crystal is activated by the M element, one or two or more kinds of which are selected from Mn, Ce, Pr, Nd, Sm, Eu, Tb, Dy, Ho, Er, Tm, and Yb. Since emission characteristics such as an excitation wavelength, an emission wavelength, and emission intensity may vary depending on the composition of the $Sr_1Si_3Al_2O_4N_4$ system crystal, and the kind and quantity of the activating element, such conditions may be chosen in accordance with an application thereof. Here, when Eu is included as the M element, a phosphor with high emission intensity can be obtained.

As mentioned above, a crystal or a crystal system in which Sr is partially substituted with Ba may be included in the $Sr_1Si_3Al_2O_4N_4$ system crystal. For example, according to a single crystal structure analysis performed for a crystal represented by $Sr_{0.5}Ba_{0.5}Si_3Al_2O_4N_4$, the $Sr_1Si_3Al_2O_4N_4$ crystal belongs to the monoclinic system and the $P2_1$ space group (space group No. 4 of the International Tables for Crystallography), and has the crystal parameters and the occupancy of the atomic coordinate positions as shown in Table 2. Meaning of every symbol in the Table is the same as in Table 1. It should be understood that the lattice constants from a to c get slightly larger and that β gets slightly larger than those of $Sr_1Si_3Al_2O_4N_4$ crystal. However, degrees of the respective changes are sufficiently small, and it may be said that the $Sr_{0.5}Ba_{0.5}Si_3Al_2O_4N_4$ crystal has the same crystal structure as the crystal shown in Table 1 in view of crystallography or engineering. In short, it may be said that the $Sr_{0.5}Ba_{0.5}Si_3Al_2O_4N_4$ crystal has the structure substantially identical to the structure as shown in FIG. 1. And, in a similar manner, it is generated that the M element to become an activating ion such as Eu is incorporated into the crystal in the type of substitution as Sr element is partially substituted with the M element. Other matter with respect to the crystal structure will be omitted herein since the other matter is also applied in a similar manner as with the $Sr_1Si_3Al_2O_4N_4$ crystal.

TABLE 2

Crystal Structure Data of $Sr_{0.5}Ba_{0.5}Si_3Al_2O_4N_4$ crystal
Crystal structure data of Sr0.5Ba0.5Si3Al2O4N4 crystal

| Crystal composition | | Sr0.5Ba0.5Si3Al2O4N4 |
|---|---|---|
| Formula weight (Z) | | 4 |
| Crystal system | | Monoclinic |
| Space group | | P2_1 |
| Space group number | | 4 |
| Lattice constants | a | 7.2832 Å |
| | b | 9.3981 Å |
| | c | 10.9116 Å |
| | α | 90 degree |
| | β | 104.592 degree |
| | γ | 90 degree |

TABLE 2-continued

Crystal Structure Data of $Sr_{0.5}Ba_{0.5}Si_3Al_2O_4N_4$ crystal
Crystal structure data of Sr0.5Ba0.5Si3Al2O4N4 crystal

| Atom | Atomic coordinate | | | Site occupancy rate |
|---|---|---|---|---|
| | x | y | z | |
| Sr, Ba(1A) | 1.044536 | 0.473338 | −0.015527 | 0.27 |
| Sr, Ba(1B) | 1.011436 | 0.45953 | −0.004532 | 0.73 |
| Sr, Ba(2A) | 0.518071 | 0.461412 | 0.494317 | 0.818 |
| Sr, Ba(2B) | 0.527507 | 0.465757 | 0.492575 | 0.182 |
| Si, Al(1) | 0.624336 | 0.694111 | −0.043038 | 1 |
| Si, Al(2) | 0.875646 | 0.693878 | 0.20939 | 1 |
| Si, Al(3) | 1.124232 | 0.693472 | 0.45748 | 1 |
| Si, Al(4) | 0.576556 | 0.919625 | 0.141609 | 1 |
| Si, Al(5) | 0.938787 | 0.972437 | 0.352856 | 1 |
| Si, Al(6) | 0.623003 | 0.193743 | 0.290888 | 1 |
| Si, Al(7) | 0.560134 | 0.471975 | 0.145815 | 1 |
| Si, Al(8) | 0.299186 | 0.705853 | 0.23335 | 1 |
| Si, Al(9) | 0.921315 | 0.420209 | 0.35998 | 1 |
| Si, Al(10) | 0.802565 | 0.707556 | −0.267297 | 1 |
| N, O(1) | 0.567451 | 0.7084 | −0.351832 | 1 |
| N, O(2) | 1.312664 | 0.705482 | 0.39259 | 1 |
| N, O(3) | 1.065794 | 0.708967 | 0.147667 | 1 |
| N, O(4) | 0.939687 | 0.605184 | 0.353734 | 1 |
| N, O(5) | 0.809863 | 0.711349 | −0.107692 | 1 |
| N, O(6) | 0.436452 | 0.603636 | −0.146085 | 1 |
| N, O(7) | 0.707528 | 0.596991 | 0.097516 | 1 |
| N, O(8) | 0.791862 | 0.096875 | 0.402387 | 1 |
| N, O(9) | 0.405715 | 0.85169 | 0.200182 | 1 |
| N, O(10) | 0.90694 | 0.854334 | −0.304607 | 1 |
| N, O(11) | 0.803631 | 0.867989 | 0.227756 | 1 |
| N, O(12) | 1.058124 | 0.868115 | 0.483193 | 1 |
| N, O(13) | 0.557952 | 0.867551 | −0.015464 | 1 |
| N, O(14) | 1.101928 | 1.052056 | 0.295831 | 1 |
| N, O(15) | 0.695289 | 0.368022 | 0.269988 | 1 |
| N, O(16) | 0.395275 | 0.551775 | 0.20007 | 1 |

Figure 3:
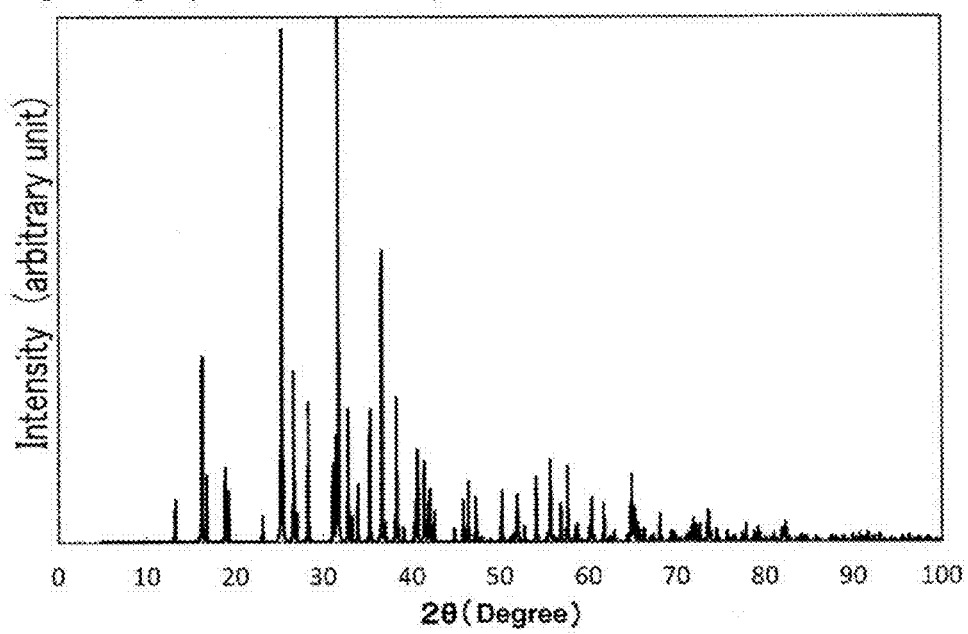
FIG. 3 is a diagram showing a powder X-ray diffraction patter using Cu Kα-line, calculated from a crystal structure of Sr$_{0.5}$Ba$_{0.5}$Si$_3$Al$_2$O$_4$N$_4$ crystal.
Figure 4:
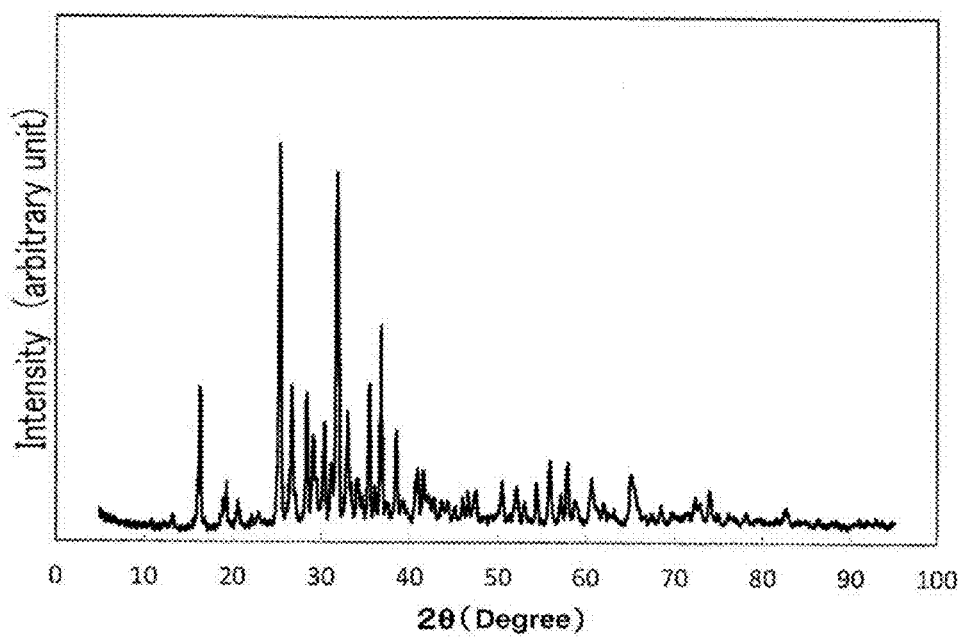
FIG. 4 is a diagram showing a resultant powder X-ray diffraction pattern of a phosphor synthesized in Example 2.
Figure 5:
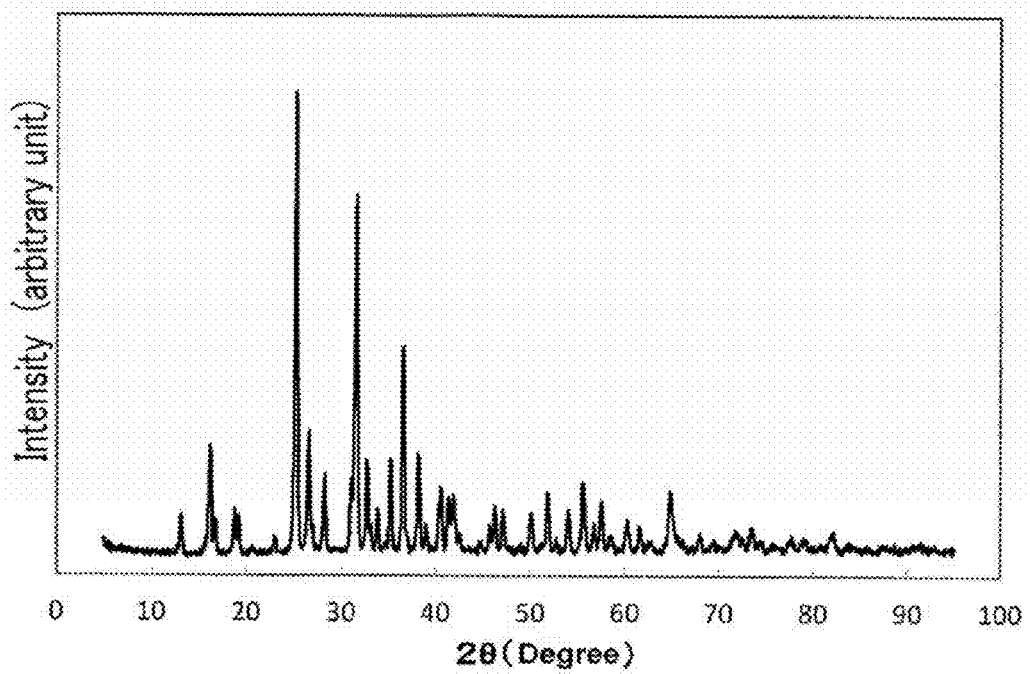
FIG. 5 is a diagram showing a resultant powder X-ray diffraction pattern of a phosphor synthesized in Example 7.
Figure 6:
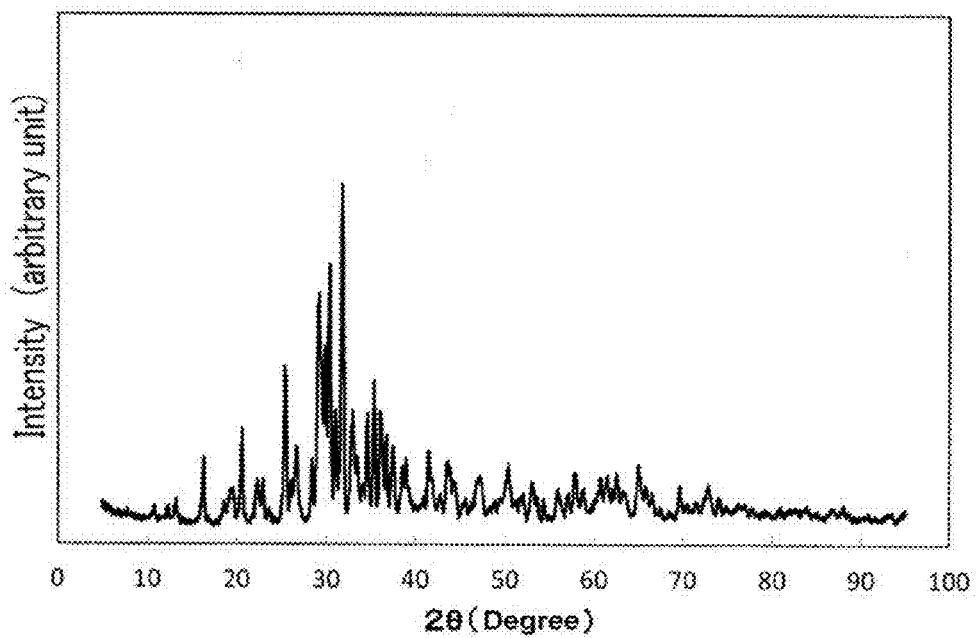
FIG. 6 is a diagram showing a resultant powder X-ray diffraction pattern of a phosphor synthesized in Example 8.
Figure 7:
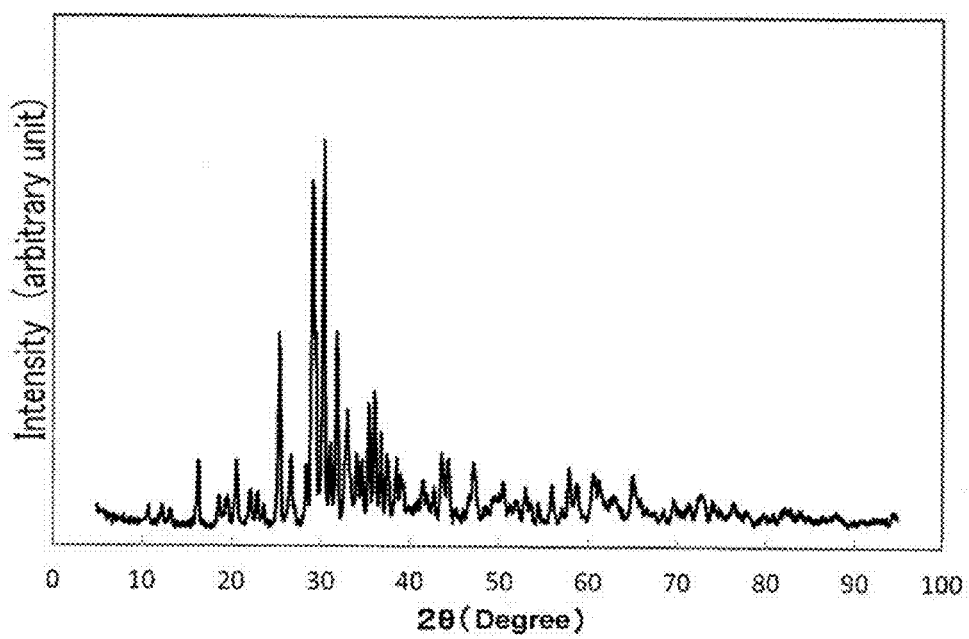
FIG. 7 is a diagram showing a resultant powder X-ray diffraction pattern of a phosphor synthesized in Example 9.
Figure 8:
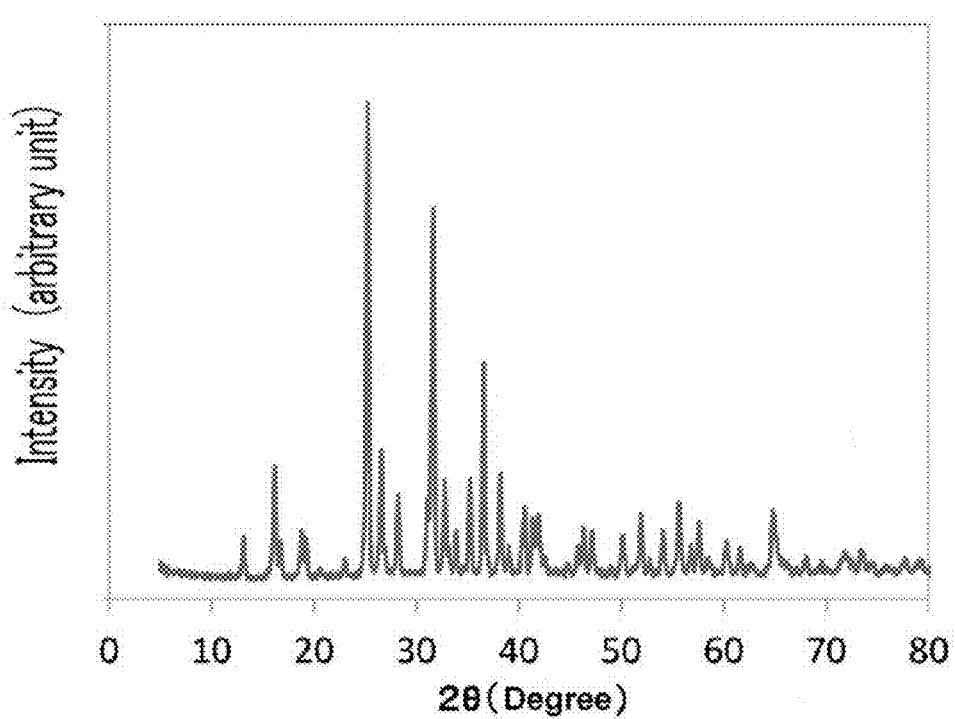
FIG. 8 is a diagram showing a resultant powder X-ray diffraction pattern of a phosphor synthesized in Example 21.
Figure 9:
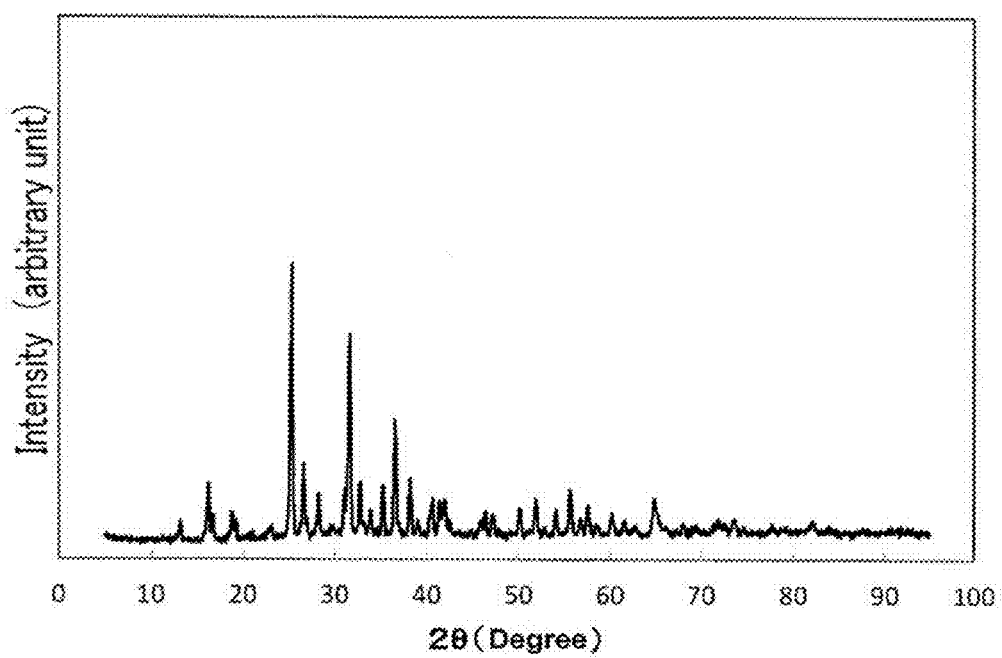
FIG. 9 is a diagram showing a resultant powder X-ray diffraction pattern of a phosphor synthesized in Example 25.
Figure 10:
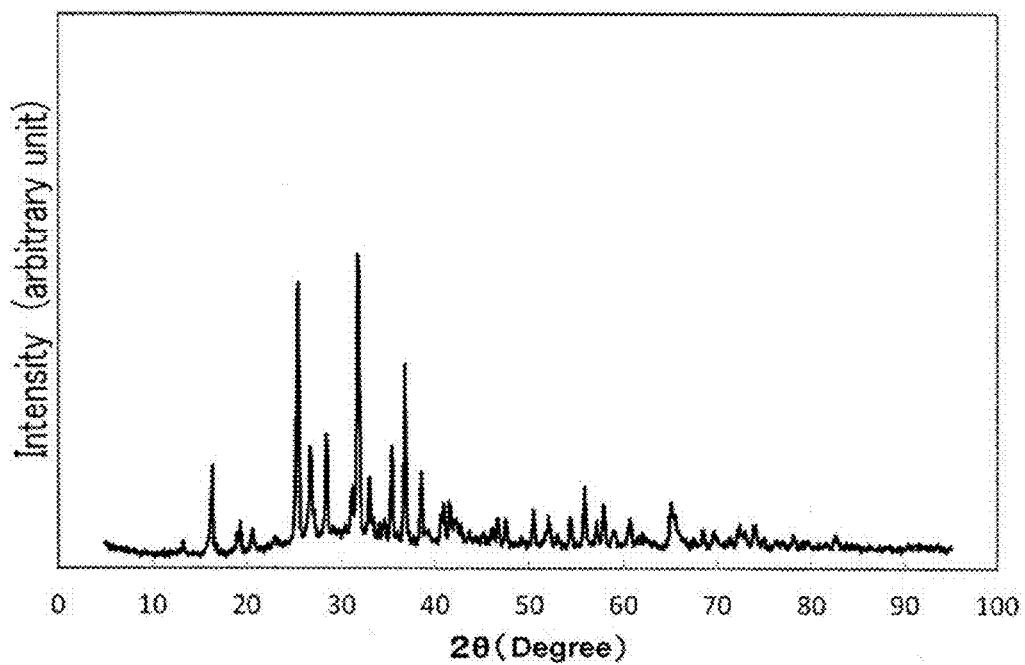
FIG. 10 is a diagram showing a resultant powder X-ray diffraction pattern of a phosphor synthesized in Example 26.
Figure 11:
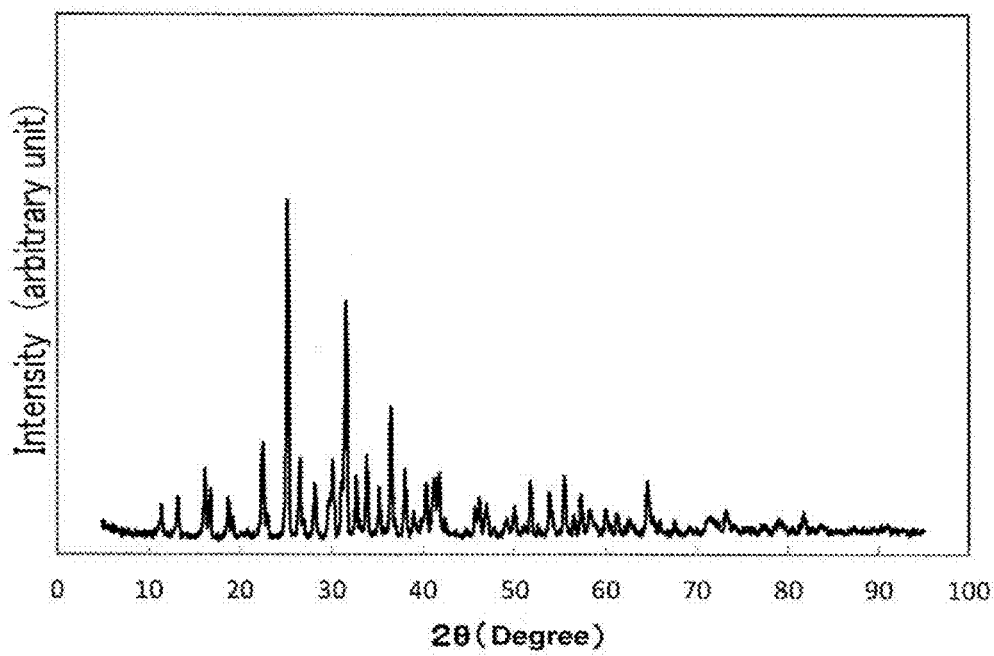
FIG. 11 is a diagram showing a resultant powder X-ray diffraction pattern of a phosphor synthesized in Example 32.
Figure 12:
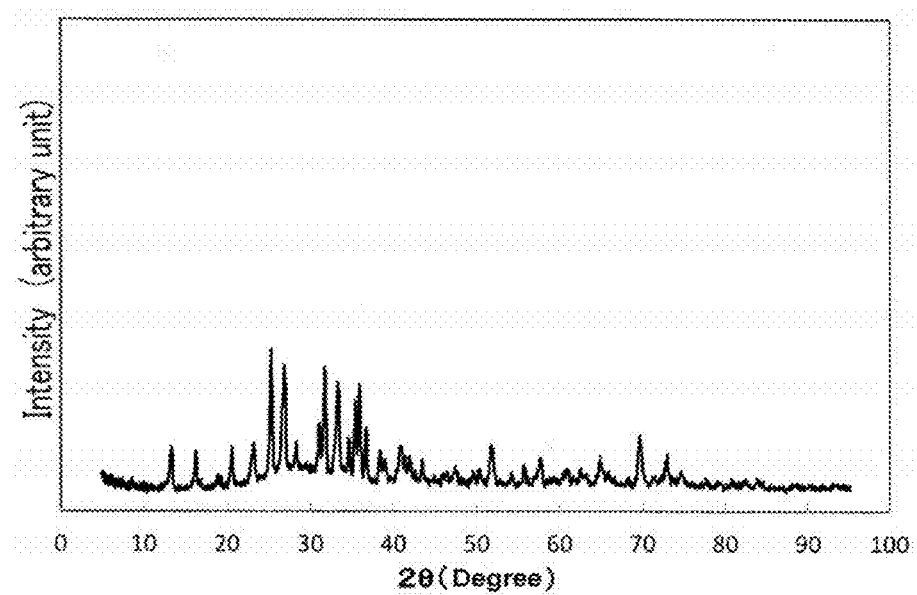
FIG. 12 is a diagram showing a resultant powder X-ray diffraction pattern of a phosphor synthesized in Example 36.
Figure 13:
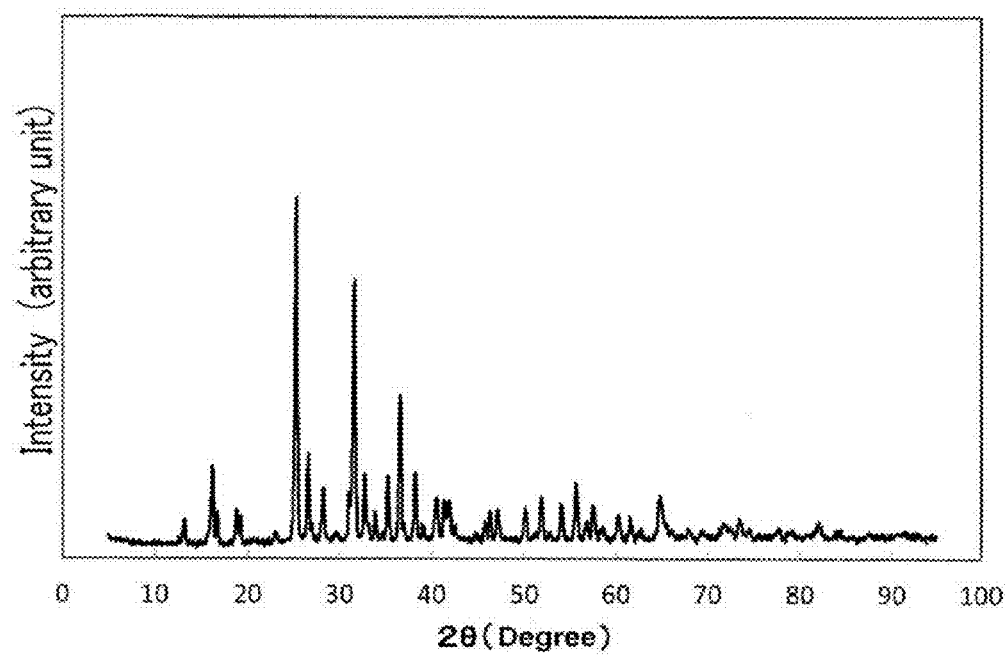
FIG. 13 is a diagram showing a resultant powder X-ray diffraction pattern of a phosphor synthesized in Example 41.
Figure 14:
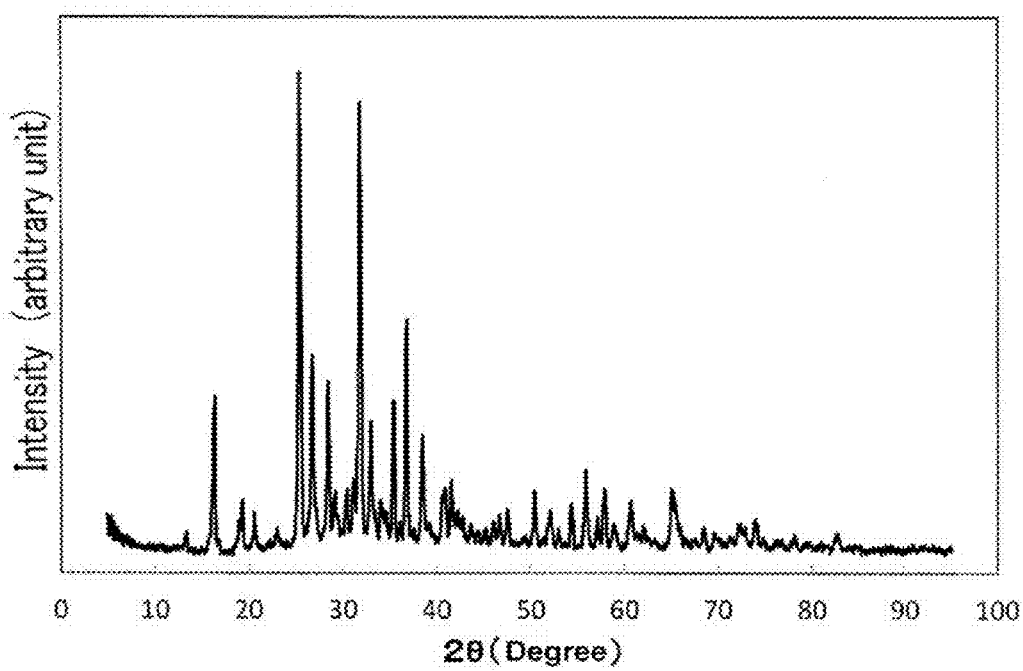
FIG. 14 is a diagram showing a resultant powder X-ray diffraction pattern of a phosphor synthesized in Example 46.
Figure 15:
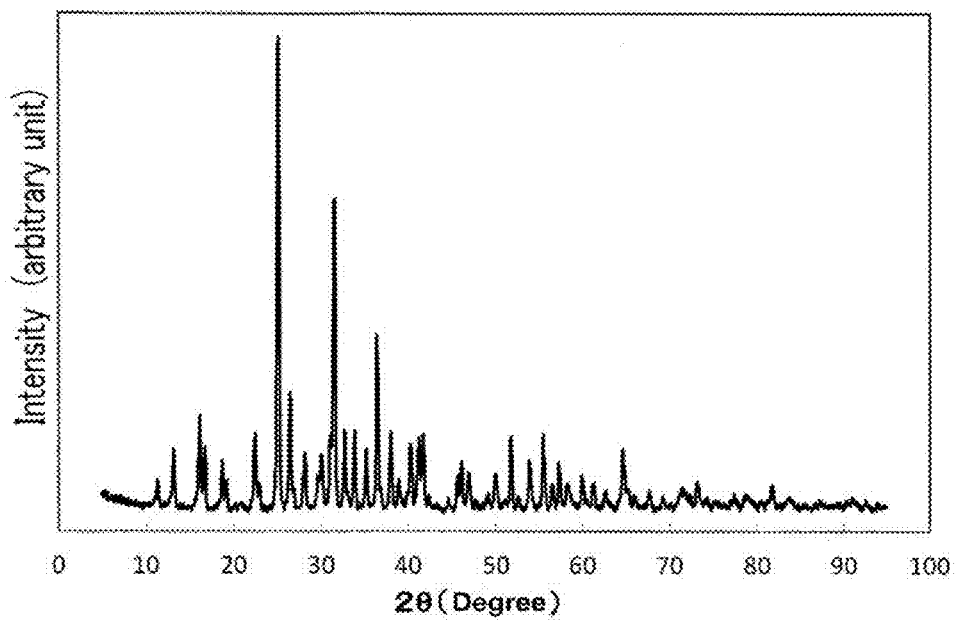
FIG. 15 is a diagram showing a resultant powder X-ray diffraction pattern of a phosphor synthesized in Example 52.
Figure 16:
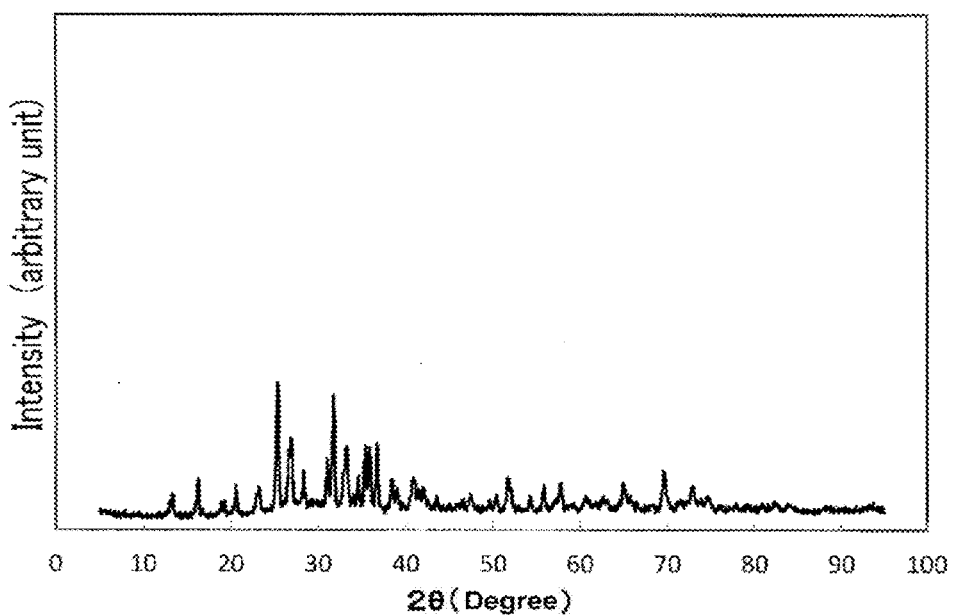
FIG. 16 is a diagram showing a resultant powder X-ray diffraction pattern of a phosphor synthesized in Example 56.
Figure 17:
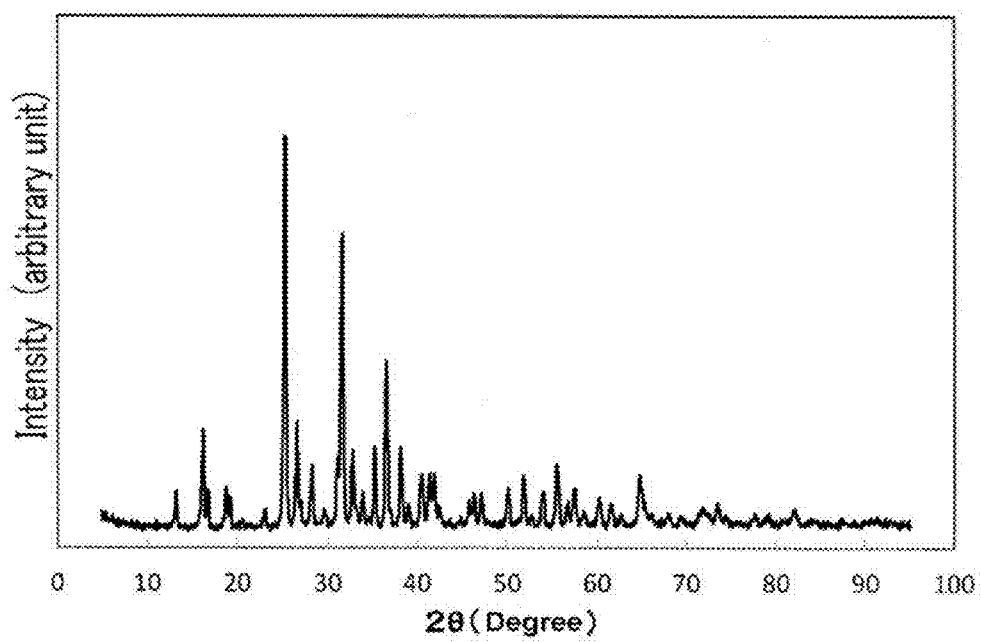
FIG. 17 is a diagram showing a resultant powder X-ray diffraction pattern of a phosphor synthesized in Example 57.

FIG. 3 is a diagram showing a powder X-ray diffraction using Cu Kα-line, calculated from the crystal structure of $Sr_{0.5}Ba_{0.5}Si_3Al_2O_4N_4$ crystal. Since there appears diffraction lines corresponding to the respective diffraction lines appearing in FIG. 2, it should be understood that the crystal has the identical crystal structure. If both FIGS. 2 and 3 are used, a simple judgment can be made more surely if it is the $Sr_1Si_3Al_2O_4N_4$ system crystal (including the $Sr_{0.5}Ba_{0.5}Si_3Al_2O_4N_4$ crystal) or not.

Also, the $Sr_1Si_3Al_2O_4N_4$ system crystal may include a $Ba_1Si_3Al_2O_4N_4$ crystal or a crystal system thereof. The $Ba_1Si_3Al_2O_4N_4$ crystal has a structure identical to the structure as shown in FIG. 1, and can exhibit an X-ray diffraction pattern as shown in FIG. 2 or 3. Then, in a similar manner with the $Sr_1Si_3Al_2O_4N_4$ crystal, the crystal or the crystal system belongs to the monoclinic system and the $P2_1$ space group (space group No. 4 of the International Tables for Crystallography).

With respect to a crystal represented by $A_1(D, E)_5X_8$, if the crystal has a composition in which, at least, the A element includes either one or both of Sr and Ba, the D element includes Si, the E element includes Al, the X element includes N, and the X element includes O if necessary, then the crystal exhibits high emission intensity. In particular, it is the phosphor exhibiting high emission intensity that includes the $Sr_1Si_3Al_2O_4N_4$ system crystal as the host crystal and has a composition in which A is a mixture of Sr and Ba, D is Si, E is Al, and X is a combination of O and N.

The phosphor in which an inorganic crystal thereof having a crystal structure identical to that of the crystal represented by $Sr_1Si_3Al_2O_4N_4$ is $Ba_1Si_3Al_2O_4N_4$ or $(Sr,Ba)_1Si_3Al_2O_4N_4$ exhibits high emission intensity as the crystal is stable.

The phosphor in which an inorganic crystal thereof having a crystal structure identical to that of the crystal represented by $Sr_1Si_3Al_2O_4N_4$ includes, as a host crystal, a crystal represented by a composition formula:

$(Sr,Ba)_1Si_{3-x}Al_{2+x}O_{4+x}N_{4-x}$ (here, −1≤x≤2), is a phosphor which exhibits high emission intensity and can be controlled in the color change of the emission by changing a composition thereof.

Here, while the M element is Eu; the D element is Si; the E element is Al; the X element is O and N; and a parameter x is used, an inorganic compound in which Eu is solid-solved into a crystal thereof having a composition formula represented by $A_1Si_{3-x}Al_{2+x}O_{4+x}N_{4-x}$, wherein −1≤x≤2, has a stable crystal and performs as a phosphor. More preferably, if the A element is a combination of Sr and Ba, the inorganic compound constitutes a blue phosphor emitting fluorescence having a peak in the range of wavelength of 440 nm to 520 nm. Moreover, if x is 0, the crystal becomes particularly stable and constitutes a phosphor to exhibit light emission of high brightness.

Here, the inorganic compound, while parameters x and y are used, may be represented by $Eu_y(Sr,Ba)_1Si_{3-x}Al_{2+x}O_{4+x}N_{4-x}$, wherein
−1≤x≤2, and
0.0001≤y≤0.5.

In such a range, it is possible to change a ratio of Eu/(Sr,Ba), a ratio of Si/Al, and a ratio of N/O within a composition range to be constituted by changing the parameters x and y while the stable crystal structure is maintained. Thus, it is a phosphor that is easy to make a material design since an excitation wavelength thereof or an emission wavelength thereof can be continuously changed by utilizing this feature.

It is Eu that is used as the activating element M such that a phosphor exhibiting particularly high emission intensity can be obtained while the phosphor includes the activating element M.

In a crystal represented by $Sr_1Si_3Al_2O_4N_4$ or an inorganic crystal having a crystal structure identical to that of the crystal represented by $Sr_1Si_3Al_2O_4N_4$, the inorganic crystal is particularly stable if the inorganic crystal is a crystal that belongs to the monoclinic system, and a phosphor having such crystal as a host crystal exhibits high emission intensity.

Further, if a crystal represented by $Sr_1Si_3Al_2O_4N_4$ or an inorganic crystal having a crystal structure identical to that of the crystal represented by $Sr_1Si_3Al_2O_4N_4$ is a crystal that belongs to the monoclinic system and has the symmetry of space group $P2_1$, and in which lattice constants thereof a, b, and c are in the following range:

$a=0.72516\pm0.05$ nm;

$b=0.93431\pm0.05$ nm; and $c=1.08761\pm0.05$ nm (here, "±0.05" indicates a so-called tolerance),
the crystal is particularly stable such that a phosphor having such inorganic crystal as a host crystal exhibits high emission intensity. If a crystal is prepared out of the above range, the crystal may become unstable and the emission intensity may occasionally decrease.

A phosphor in which an inorganic compound is represented by a composition formula $M_dA_eD_fE_gX_h$ (here, in the formula, d+e+f+g+h=1, M is one or two or more kinds of elements selected from Mn, Ce, Pr, Nd, Sm, Eu, Tb, Dy, and Yb; A is one or two or more kinds of elements selected from Mg, Ca, Sr, and Ba; D is one or two or more kinds of elements selected from Si, Ge, Sn, Ti, Zr, and HL E is one or two or more kinds of elements selected from B, Al, Ga, In, Sc, Y, and La; X is one or two or more kinds of elements selected from O, N, and F), and parameters d, e, f, g, and h satisfy all conditions:

$0.00001 \leq d \leq 0.05;$ $0.05 \leq e \leq 0.1;$ $0.07 \leq f \leq 0.3;$ $\mathbf{0.07} \leq g \leq 0.3;$ and $0.45 \leq h \leq 0.6,$ exhibits particularly high emission intensity.

The parameter d represents an additive amount of the activating element, and if the amount is less than 0.00001, an amount of light-emitting ions is insufficient so as to cause brightness to decrease. If the amount is more than 0.05, the emission intensity may be decreased due to the concentration quenching by a mutual interaction between light-emitting ions. The parameter e is a parameter representing a constituent amount of the alkaline earth element such as Ba, and if the amount is less than 0.05 or higher than 0.1, the crystal structure becomes unstable so as to cause the emission intensity to decrease. The parameter f is a parameter representing a constituent amount of the D element such as Si, and if the amount is less than 0.07 or higher than 0.3, the crystal structure becomes unstable so as to cause the emission intensity to decrease. The parameter g is a parameter representing a constituent amount of the E element such as Al, and if the amount is less than 0.07 or higher than 0.3, the crystal structure becomes unstable so as to cause the emission intensity to decrease. The parameter h is a parameter representing a constituent amount of the X element such as O, N, and F, and if the amount is less than 0.45 or higher than 0.6, the crystal structure becomes unstable so as to cause the emission intensity to decrease. The X element is an anion, and a composition ratio of O, N, and F is determined in order to maintain the charge neutrality with cations of the A, M, D and E elements.

Further, a phosphor including an inorganic compound satisfying the following relationship:

$0.5/5 \leq (d+e)/(f+g) \leq 2/5$ in the above-mentioned composition formula, has excellent fluorescence characteristics.

A phosphor including an inorganic compound satisfying the following relationship:

$0.9/5 \leq (d+e)/(f+g) \leq 1.2/5,$ in the above-mentioned composition, exhibits emission of high brightness so as to be desirable.

A phosphor including an inorganic compound satisfying the following relationship:

$1.0/5 \leq (d+e)/(f+g) \leq 1.2/5,$ in the composition, exhibits emission of further high brightness so as to be more desirable.

Further, a phosphor including an inorganic compound in which the parameters d, e, f, g, and h have values in the range satisfying all the following conditions:

$0.06 \leq d+e \leq (1/14)+0.05;$ $(5/14)-0.05 \leq f+g \leq (5/14)+0.05;$ and $(8/14)-0.05 \leq h \leq 0.6,$ in the composition formula, has the crystal structure that is stable and exhibits particularly high emission intensity. Among the above-mentioned crystals, a crystal having the composition satisfying all the following conditions:

$d+e=1/14;$ $f+g=5/14;$ and $h=8/14,$ that is to say, the crystal having the composition of $(M,A)_1(D,E)_5X_8$, is particularly stable in the crystal structure thereof such that the phosphor constituted of the crystal exhibits particularly high emission intensity.

Further, the phosphor having a composition in which the parameters f and g satisfies the condition:

$2/5 \leq f/(f+g) \leq 4/5,$ has the crystal structure that is stable and exhibits high emission intensity.

Further, if a phosphor includes an inorganic compound in which the X element includes N and O in the composition formula and which is represented by a composition formula $M_d A_e D_f E_g O_{h1} N_{h2}$ (here, d+e+f+g+h1+h2=1, and h1+h2=h in the formula) and satisfies the following condition:

$2/8 \leq h1/(h1+h2) \leq 6/8,$ the phosphor exhibits excellent fluorescence characteristics.

Further, if a phosphor preferably includes an inorganic compound satisfying the following condition:

$3.5/8 \leq h1/(h1+h2) \leq 4.5/8,$ in the composition formula, the phosphor exhibits excellent fluorescence characteristics. If a ratio of numbers of respective atoms of N and O included in the inorganic compound satisfies the condition as described above, a crystal structure to be mentioned later of the inorganic crystal is stable and the phosphor exhibits high emission intensity.

If the phosphor more preferably includes the inorganic compound satisfying the following condition:

$3.6/8 \leq h1/(h1+h2) \leq 4.1/8$ in the composition formula, the phosphor exhibits further high emission intensity.

A phosphor including at least Eu as the M element being the activating element is a phosphor exhibiting high emission intensity among the phosphors of the present invention, and the phosphor emits fluorescence having a peak in a wavelength range of 400 nm to 590 nm if the phosphor is irradiated with an excitation source.

A phosphor having a composition including at least Sr and/or Ba as the A element, at least Si as the D element, at least Al as the E element, and at least N and O as the X element, exhibits high emission intensity and emits fluorescence of a blue color having a peak in a wavelength range of 440 nm to 520 nm if it is irradiated with an excitation source. The phosphor more desirably includes both Sr and Ba as the A element. In this way, the crystal structure to be mentioned later becomes more stable and the emission intensity of the phosphor becomes high. Further, the phosphor may also include boron as the E element, and in this case, the content amount of boron is 0.001 mass % or more and 1 mass % or less. In this way, the emission intensity can become higher.

A phosphor in which an inorganic compound includes single crystal particles or an aggregate of the single crystals having a mean particle diameter of 0.1 μm or more to 20 μm or less has high emission efficiency and a good handling property when it is applied to an LED such that it is good to control the particle diameter thereof in this range.

Impurity elements of Fe, Co, and Ni included in the inorganic compound may cause the emission intensity to decrease. If the sum of these impurity elements in the phosphor is controlled to be 500 ppm or less, an influence of these elements on the emission intensity is decreased.

As one of the embodiments of the present invention, there is a phosphor constituted of a mixture of a phosphor having the $Sr_1Si_3Al_2O_4N_4$ system crystal as the host crystal and another kind of crystal phase or another kind of amorphous phase other than this system crystal wherein a content amount of the $Sr_1Si_3Al_2O_4N_4$ system crystal is 20 mass % or more. In the case where target characteristics cannot be obtained with a single phosphor of the $Sr_1Si_3Al_2O_4N_4$ system crystal by itself, or in the case where an additional function such as conductivity is added, the phosphor of the present embodiment may be utilized. The content amount of the $Sr_1Si_3Al_2O_4N_4$ system crystal phosphor may be adjusted in accordance with the target characteristics, but the emission intensity of the phosphor may be lowered if the content amount is 20 mass % or less.

In the case where the phosphor is supposed to need electrical conductivity in an application in which electron beam excitation or the like is employed, an inorganic substance having electrical conductivity may be added thereto as another crystal phase or an amorphous phase.

As the inorganic substance having the electrical conductivity, oxide; oxynitride; or nitride of one or two or more kinds of elements selected from Zn, Al, Ga, In, and Sn, or a mixture of the above may be named. For example, zinc oxide, aluminum nitride, indium nitride, tin oxide, and so on may be named.

In the case where a target emission spectrum cannot be achieved with a single phosphor of the $Sr_1Si_3Al_2O_4N_4$ system crystal, a second phosphor other than the phosphor of the $Sr_1Si_3Al_2O_4N_4$ system crystal may be added. As examples of the other phosphors, a BAM phosphor, a β-sialon phosphor, an α-sialon phosphor, a $(Sr, Ba)_2Si_5N_8$ phosphor, a $CaAlSiN_3$ phosphor, and a $(Ca, Sr)AlSiN_3$ phosphor may be named. Alternatively, a crystal phase other than the above-mentioned crystal phases or an amorphous phase may be utilized as the other phosphor.

As one of the embodiments of the present invention, there is a phosphor having a peak at a wavelength in the range of 400 nm to 590 nm by irradiation with an excitation source. For example, a phosphor of the $Sr_1Si_3Al_2O_4N_4$ system crystal in which Eu is activated has an emission peak in this range by adjusting the composition.

As one of the embodiments of the present invention, there is a phosphor having a peak at a wavelength in the range of 440 nm to 520 nm by irradiation with an excitation source. For example, there is a phosphor including the above-mentioned inorganic compound in which the M element is Eu, the A element is Sr and Ba, the D element is Si, the E element is Al, the X element is N and O, and Eu is incorporated into the $(Sr, Ba)_1Si_3Al_2O_4N_4$ crystal. In this arrangement, since the phosphor emits blue fluorescence of 440 nm or more to 520 nm or less when the phosphor is irradiated with light of 295 nm to 420 nm, the phosphor may be utilized in an application in which blue color emission is desired, such as a white LED.

As one of the embodiments of the present invention, there is a phosphor emitting light with vacuum ultraviolet light, ultraviolet light, or visible light, each of which has a wavelength that is in each specific range among from 100 nm to 420, or electron beam or X-ray as an excitation source. The phosphor can be made to emit light efficiently by using such excitation source.

As one of the embodiments of the present invention, there is a phosphor to emit light upon irradiation of an excitation source wherein a color of the light may be expressed by values of (x, y) on the CIE 1931 chromaticity coordinates which are in the following range:

$0.05 \le x \le 0.3$; and $0.02 \le y \le 0.4$.

For example, it is possible to obtain a phosphor emitting light of the color in the above range on the chromaticity coordinates by adjusting the composition given by

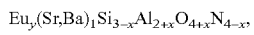

which satisfies:

$-1 \le x \le 2$, and $0.0001 \le y \le 0.5$.

The obtained phosphor may be utilized in an application of blue light emission such as a white LED.

Thus, as compared with an ordinary oxide phosphor or an existing sialon phosphor, the phosphor of the present invention is characterized by having a wider excitation range of an electron beam and X-ray and light from ultraviolet light to visible light, emitting light of a blue color, and, in particular, both emitting light of a blue color from 440 nm to 520 nm with a specific composition thereof and being capable of adjusting an emission wavelength and an emission peak width. Thus, the phosphor of the present invention is suitable for an illuminating device, an image display device, pigment, and an ultraviolet absorber because of such emission characteristics. The phosphor of the present invention has also advantages of excellent heat resistance since it does not degrade even if it is exposed to high temperature, and excellent long-term stability under an oxidizing atmosphere and a moisture environment, and thus a product having excellent durability can be provided by utilizing the phosphor.

A method of manufacturing such a phosphor of the present invention is not particularly limited, but, for example, a mixture of metal compounds being a raw material mixture that can constitute the phosphor of the $Sr_1Si_3Al_2O_4N_4$ system crystal is fired in a nitrogen-containing inert atmosphere within the temperature range of 1,200° C. or higher to 2,200° C. or lower. The phosphor of the present invention can also be obtained by firing the raw material mixture at a temperature of 1,000° C. or higher so as to allow the raw material mixture to react. The above-mentioned firing temperature is preferably 1,200° C. or higher in order to allow the mixture to react more sufficiently, and further preferably, 1,600° C. or higher in order to further promote the reaction. However, it is not preferable that the firing temperature exceeds 2,200° C., although it depends on the kind and the pressure of an atmosphere, since the $Sr_1Si_3Al_2O_4N_4$ system crystal tends to easily proceed with decomposition in the atmosphere of 1 MPa of nitrogen as a main component or 100% nitrogen when the firing temperature exceeds 2,200° C. The firing temperature is more preferably 2,000° C. or lower, and still further preferably 1,800° C. or lower. When ambient pressure becomes higher, the decomposition is suppressed even at a higher temperature, on the other hand, when the ambient pressure becomes lower, the decomposition may occur even at a low temperature. Therefore, in order to suppress the decomposition, it is preferable to perform the firing in higher pressure and at lower temperature. Further, the time period of firing may be satisfactorily shorter at higher temperature and preferably longer at lower temperature. For example, in the case where the firing is performed at 1,600° C., it may be 0.1 hour or longer, more preferably 1 hour or longer, and still further preferably 2 hours or longer. On the other hand, if energy saving or decomposition prevention of the compound is taken into consideration, it is preferably 100 hours or shorter, more preferably 10 hours or shorter, and still further preferably 8 hours or shorter. While the main crystal of the present invention belongs to the monoclinic system and the space group $P2_1$, another crystal that belongs to another crystal system and another space group other than the above may be occasionally mixed therein depending on synthesis conditions such as firing temperature. However, even in such a case, a change of the emission characteristics is slight and therefore the thus-obtained product can be used as a high brightness phosphor.

As a starting material, for example, a mixture of metal compounds, which comprises a compound including M, a compound including A, a compound including D, a compound including E, and a compound including X (here, M is one or two or more kinds of elements selected from Mn, Ce, Pr, Nd, Sm, Eu, Tb, Dy, and Yb; A is one or two or more kinds of elements selected from Mg, Ca, Sr, and Ba; D is one or two or more kinds of elements selected from Si, Ge, Sn, Ti, Zr, and HE E is one or two or more kinds of elements selected from B, Al, Ga, In, Sc, Y, and La; and X is one or two or more kinds of elements selected from O, N, and F), may be satisfactorily used.

As the starting material, the mixture, which comprises the compound including M that is a single substance or a mixture of at least two kinds of substances selected from metal, silicide, oxide, carbonate, nitride, oxynitride, chloride, fluoride, or oxyfluoride including M; the compound including A that is a single substance or a mixture of at least two kinds of substances selected from metal, silicide, oxide, carbonate, nitride, oxynitride, chloride, fluoride, or oxyfluoride including A; and the compound including D that is a single substance or a mixture of at least two kinds of substances selected from a metal, silicide, oxide, carbonate, nitride, oxynitride, chloride, fluoride or oxyfluoride, is preferable because these raw materials are easily available and have excellent stability. The mixture, which comprises the compound including X that is a single substance or a mixture of at least two kinds of substances selected from oxide, nitride, oxynitride, fluoride, and oxyfluoride, is preferable because each raw material is easily available and has excellent stability.

In the case where a phosphor of the $(Sr,Ba)_1Si_3Al_2O_4N_4$ crystal system activated by Eu is manufactured, it is preferable to use a starting material comprising, at least, nitride or oxide of europium; nitride, oxide, or carbonate of strontium and/or nitride, oxide, or carbonate of barium; silicon oxide or silicon nitride; and aluminum oxide or aluminum nitride since the reaction tends to easily proceed during the firing.

Since the firing temperature is high and the firing atmosphere is an inert atmosphere containing nitrogen, an electric furnace of a metal resistance heating type or a graphite resistance heating type, in which a high temperature member of the furnace made of carbon is used, is suitable as a furnace for firing. The nitrogen-containing inert atmosphere in the pressure range of 0.1 MPa or more to 100 MPa or less is preferable because thermal decomposition of nitride or oxynitride of the starting material or the product is suppressed. It is preferable that the oxygen partial pressure is 0.0001% or lower in the firing atmosphere in order to suppress the oxidation reaction of nitride or oxynitride of the starting material or the product. Graphite may be satisfactorily used for a heating element, a heat-insulating element, or a sample container of the firing furnace.

In order to manufacture the phosphor in the form of powder or aggregate, it is preferable to utilize a method of firing raw materials after the raw materials are filled in a container with a filling rate kept at the bulk density of 40% or lower. It is possible to prevent particles from adhering with each other by maintaining the bulk density of 40% or lower in the filling rate. Here, the term relative bulk density means the ratio of a value (bulk density) given by dividing the mass of powder material filled in the container by the capacity of the container to the real density of the substance of the powder material.

Various kinds of heat-resistant materials can be used for the container containing the raw material compound in firing the raw material mixture. However, in view of a low adverse effect of material deterioration on the metal nitride used in the present invention, a material suitably includes a boron nitride coated container, which is exemplified by a boron nitride coated graphite crucible used for synthesis of an α-sialon as described in a scientific journal "Journal of the American Ceramic Society" Vol. 85, No. 5, pages 1229 to 1234 in 2002 (the document is incorporated herein by reference.), or boron nitride sintered body. When the firing is performed under such conditions, boron or boron nitride component is mixed into the product from the container, but, if the amount thereof is small, an effect of mixing is slight since the emission characteristics are not decreased. Further, durability of the product may be occasionally improved by the addition of a small amount of boron nitride thereto, and such addition may be preferable in some cases.

In order to manufacture the phosphor in the form of powder or aggregate, it is preferable to make the mean particle diameter of powder particles or aggregate of the raw material equal to or less than 500 μm since the raw material has excellent reactivity and handling characteristics.

As a method of adjusting a particle size of the particles or aggregates to be 500 μm or less, it is preferable to employ a spray dryer, sieving, or pneumatic classification since such a method has excellent operating efficiency and handling characteristics.

As a method of firing, not the hot-pressing, but a method of firing, in which no external mechanical pressing is applied, such as pressureless sintering method and gas pressure sintering method is preferable as a method of obtaining a product of powder or aggregate.

A mean particle diameter of phosphor powder is preferably 50 nm or more to 200 μm or less in terms of a volume-based median diameter (d50) because the emission intensity is high. The volume-based mean particle diameter can be measured, for example, according to a Microtrac or a laser light scattering method. A mean particle diameter of phosphor powder synthesized by firing may be satisfactorily adjusted to be 50 nm or more to 200 μm or less by applying at least one technique selected from pulverization, classification and acid treatment.

A defect or damage caused by pulverization included in powder may be occasionally cured by heat-treating of phosphor powder after firing, phosphor powder after pulverizing treatment, or phosphor powder after controlling a particle size at a temperature of 1,000° C. or higher to the firing temperature or lower. The defect or damage may occasionally cause a decrease in the emission intensity, and in such a case, the emission intensity recovers by the heat treatment.

During firing for synthesis of the phosphor, a stable crystal may be occasionally obtained by adding an inorganic compound forming a liquid phase at a temperature of a firing temperature or lower and firing a mixture thereof such that the liquid phase acts as a flux to promote the reaction and particle growth, and thus the emission intensity may be occasionally improved.

Specific examples of the inorganic compound forming the liquid phase at the temperature of the firing temperature or lower include a single substance or a mixture of two or more kinds of fluoride, chloride, iodide, bromide, or phosphate of one or two or more kinds of elements selected from Li, Na, K, Mg, Ca, Sr, and Ba. The inorganic compounds have different melting points, respectively, and therefore may be satisfactorily used properly depending on a synthesizing temperature.

Further, the emission intensity of the phosphor may occasionally become high by reducing the content amount of the inorganic compound forming the liquid phase at the temperature of the firing temperature or lower by washing the phosphor with a solvent after the firing.

When the phosphor of the present invention is used in an application of a light-emitting unit or the like, it is preferable to use the phosphor dispersed in a liquid medium. Further, the phosphor can also be used in the form of a phosphor mixture containing the phosphor of the present invention. A composition prepared by dispersing the phosphor of the present invention in the liquid medium is referred to as a phosphor-containing composition.

As the liquid medium that can be used for the phosphor-containing composition of the present invention, any liquid medium can be selected depending on a purpose or the like, if the liquid medium shows liquid properties under desired use conditions to suitably disperse the phosphor of the present invention, and simultaneously does not cause an undesirable reaction or the like. Specific examples of the liquid medium include an addition reaction type silicone resin and a condensation reaction type silicone resin before curing, a modified silicone resin, an epoxy resin, a polyvinyl resin, a polyethylene resin, a polypropylene resin and a polyester resin. With respect to the liquid media, a single kind of liquid medium may be used by itself, or any combination of two or more kinds of liquid media with any combination ratio thereof may be used.

An amount of used liquid medium or media may be appropriately adjusted depending on an application or the like. In general, the amount is in the range of generally 3 wt % or more and preferably 5 wt % or more, to generally 30 wt % or less and preferably 15 wt % or less in terms of the weight ratio of the liquid medium to the phosphor of the present invention.

Further, the phosphor-containing composition of the present invention may contain, in addition to the phosphor and the liquid medium, any other component depending on an application or the like. Specific examples of any other component include a dispersing agent, a thickening agent, an extending agent and a buffering agent. Specifically, the examples include silica fine powder such as Aerosil, and alumina.

The light-emitting device of the present invention is configured with at least a light-emitting body or an emission source and the phosphor (hereinafter, referred to as first phosphor) of the present invention.

As the light-emitting body or the emission source, there are an LED light-emitting device, a laser diode light-emitting device. an electroluminescence (EL) light-emitting device, a fluorescent lamp, and so on. The LED light-emitting unit can be manufactured using the phosphor of the present invention and a publicly known method which is described in Japanese Patent Application Publication No. H05-152609, Japanese Patent Application Publication No. H07-99345, Japanese Patent No. 2927279, and the like. In this case, the light-emitting body or the emission source is preferably what emits light of a wavelength region of from 330 to 500 nm. In particular, an LED light-emitting element emitting an ultraviolet (or violet) ray of a wavelength region of 330 to 420 nm, or an LED light-emitting element emitting blue light in a wavelength region of 420 to 480 nm is preferable. Such LED light-emitting elements include a nitride semiconductor such as GaN or InGaN, which can be an emission source of a predetermined wavelength by adjusting the composition.

As a light-emitting unit of the present invention, there are a white light-emitting diode, an illuminating device including a plurality of white light-emitting diodes, a backlight for a liquid crystal panel, and the like, which include the phosphor of the present invention, respectively.

In such light-emitting devices, in addition to the first phosphor, the device may further include one or two or more kinds of phosphor selected from β-sialon phosphor activated with Eu, α-sialon yellow phosphor activated with Eu, $Sr_2Si_5N_8$ orange phosphor activated with Eu, (Ca, Sr)$AlSiN_3$ orange phosphor activated with Eu, and $CaAlSiN_3$ red phosphor activated with Eu. As the yellow phosphor other than the above, for example, YAG:Ce, (Ca, Sr, Ba)$Si_2O_2N_2$:Eu, and the like may be used.

As one aspect of the light-emitting unit of the present invention, there is a light-emitting unit in which a light-emitting body or an emission source emits ultraviolet light or visible light having a peak wavelength of 300 to 420 nm such that the phosphor of the present invention emits light of a blue color, which is mixed with light having a wavelength of 470 nm or more emitted by the other phosphor (also, referred to as a second phosphor) of the present invention such that the light-emitting unit emits light of a white color or light of another color other than the white color.

As one aspect of the light-emitting unit of the present invention, in addition to the first phosphor, a blue phosphor emitting light having a peak wavelength of 420 nm to 500 nm or less by means of the light-emitting body or the emission source can further be included. Specific examples of such a blue phosphor include AlN:(Eu, Si), $BaMgAl_{10}O_{17}$:Eu, $SrSi_9Al_{19}O_{31}$:Eu, $LaSi_9Al_{19}N_{32}$:Eu, α-sialon:Ce, JEM:Ce, and so on.

As one aspect of the light-emitting unit of the present invention, in addition to the first phosphor, a green phosphor emitting light having a peak wavelength of 500 nm or more to 550 nm or less by means of the light-emitting body or the emission source can further be included. Specific examples of such a green phosphor include β-sialon:Eu, (Ba, Sr, Ca, Mg)$_2SiO_4$:Eu, (Ca, Sr, Ba)$Si_2O_2N_2$:Eu, and so on.

As one aspect of the light-emitting unit of the present invention, in addition to the first phosphor, a yellow phosphor emitting light having a peak wavelength of 550 nm or more to 600 nm or less by mean of the light-emitting body or the emission source can further be included. Specific examples of such a yellow phosphor include YAG:Ce, α-sialon:Eu, $CaAlSiN_3$:Ce, $La_3Si_6N_{11}$:Ce, and so on.

As one aspect of the light-emitting unit of the present invention, in addition to the first phosphor, a red phosphor emitting light having a peak wavelength of 600 nm or more to 700 nm or less by means of the light-emitting body or the emission source can be further included. Specific examples of such a red phosphor include $CaAlSiN_3$:Eu, (Ca, Sr)$AlSiN_3$:Eu, $Ca_2Si_5N_8$:Eu, $Sr_2Si_5N_8$:Eu, and so on.

As one aspect of the light-emitting unit of the present invention, a light-emitting unit with high efficiency can be configured since the emission efficiency is high if an LED in which the light-emitting body or the emission source emits light having a wavelength of 320 to 420 nm is used.

The image display device of the present invention is configured with at least an excitation source and the phosphor of the present invention and includes a vacuum fluorescent display (VFD), a field emission display (FED), a plasma display panel (PDP), a cathode-ray tube (CRT), and the like. It has been confirmed that the phosphor of the present invention emits light by excitation of a vacuum ultraviolet ray of 100 to 190 nm, an ultraviolet ray of 190 to 380 nm, an electron beam, or the like, and the above image display devices can be configured by combining these excitation sources and the phosphors of the present invention.

The phosphor comprising an inorganic compound crystal phase having a specific chemical composition according to the present invention has a white color as an object color, and thus can be used as a pigment or fluorescent pigment. That is, the object color of white is observed when the phosphor of the present invention is irradiated with sunlight or light from a fluorescent lamp or the like. In view of a good coloring and no degradation over a long period of time, the phosphor of the present invention is suitable for an inorganic pigment. Therefore, when the phosphor of the present invention is used for a paint, ink, color, glaze, colorant to be added to a plastic product or the like, a favorable coloring can be maintained at a high level for a long period of time.

The nitride phosphor of the present invention absorbs ultraviolet light and therefore is suitable also as the ultraviolet absorber. Thus, when the nitride phosphor of the present invention is used as the paint or applied onto a surface of the plastic product or kneaded into an inside thereof, the nitride phosphor has a high effect on screening ultraviolet light to effectively allow protection of a product from ultraviolet degradation.

Example

The present invention will be described in more detail with reference to the examples to be shown below, but these examples are disclosed only for the purpose of facilitating understanding the present invention readily such that the present invention is not limited to these examples.

[Raw Materials Used for Synthesis]

The raw material powders used for the synthesis were: silicon nitride powder with a particle size of specific surface area of 11.2 m$^2$/g, oxygen content of 1.29 wt %, and α type content of 95% (SN-E10 grade made by Ube Industries, Ltd.); silicon dioxide powder ($SiO_2$; made by Kojundo Chemical Laboratory Co., Ltd.); aluminum nitride powder with a particle size of specific surface area of 3.3 m$^2$/g and oxygen content of 0.82 wt % (E grade made by Tokuyama Corporation); aluminum oxide powder with a particle size of specific surface area of 13.2 m$^2$/g (TAIMICRON made by Daimei Chemicals Co., Ltd.); calcium oxide (made by Kojundo Chemical Laboratory Co., Ltd.); strontium oxide (made by Kojundo Chemical Laboratory Co., Ltd.); barium oxide (BaO; made by Kojundo Chemical Laboratory Co., Ltd.); cerium oxide ($CeO_2$; with purity of 99.9% made by Shin-Etsu Chemical Co., Ltd.); europium oxide ($Eu_2O_3$; with purity of 99.9% made by Shin-Etsu Chemical Co., Ltd.); and rare earth oxide (purity of 99.9% made by Shin-Etsu Chemical Co., Ltd.).

[Synthesis and Structure Analysis of $Sr_1Si_3Al_2O_4N_4$ Crystal]

A mixture composition having fractions of silicon nitride of 40.56 mass %, aluminum oxide of 29.48 mass %, and strontium oxide of 29.96 mass % was designed. These raw material powders were weighed to be a mixture composition, and mixed for 5 minutes using a pestle and a mortar, each of them being made of sintered silicon nitride body. Next, the powder mixture obtained was fed into a crucible made of sintered boron nitride body. A bulk density of the powder mixture (powder) was approximately 30%.

The crucible containing the powder mixture was set into an electric furnace of a graphite resistance heating type. In the firing operation, first the firing atmosphere was made vacuum of $1 \times 10^{-1}$ Pa or less with a diffusion pump, and heated from the room temperature to 800° C. at a rate of 500° C. per hour. Nitrogen of 99.999 vol % purity was introduced at 800° C. to raise the pressure inside the furnace to 1 MPa, and the temperature was further raised to 1900° C. at a rate of 500° C. per hour, and then the temperature was maintained for two (2) hours.

A synthesized material was observed by means of an optical microscope and a crystal particle having a size of 17 µm×10 µm×10 µm was collected out of the synthesized material. The crystal particle was analyzed using a scanning electron microscope (SEM; SU1510 made by Hitachi High-Technologies Corp.) equipped with an energy dispersive elemental analyzer (EDS; QUANTAX made by Bruker AXS Inc.) so as to perform the elemental analysis for the elements included in the crystal particle. As a result, presence of Sr, Si, Al, and N elements was confirmed, and ratios of the respective number of contained atoms of Sr, Si, and Al were measured to be 1:3:2.

Next, the crystal was fixed to a tip top of a glass fiber with an organic adhesive. An X-ray diffraction measurement of the crystal was performed under a condition in which an output of an X-ray source was 50 kV and 50 mA using a single crystal X-ray diffractometer with a rotating target of Mo Kα-line (SMART APEX II Ultra made by Bruker AXS Inc.). As a result, the crystal particle was confirmed to be a single crystal.

Next, the crystal structure of the crystal was determined using single crystal structure analysis software (APEX2 made by Bruker AXS Inc.) from the results of X-ray diffraction measurement. The crystal structure data obtained are shown in Table 1, and diagrams of the crystal structure are shown in FIG. 1. The crystal system, the space group, the lattice constants, and the kinds and positions of atoms are described in Table 1, and the shape and the size of the unit cell and the arrangement of atoms therein can be determined using the data. In addition, Si and Al enter in equivalent atom positions with a certain ratio, and oxygen and nitrogen enter in equivalent atom positions at a certain ratio, and when the ratios are averaged as a whole, the averaged ratio matches the composition fractions of the crystal. The R value ($R_1$) being a value showing reliability of analysis results was 0.0659, and highly reliable analysis results were obtained.

It was found that the crystal belonged to the monoclinic system, and belonged to the space group $P2_1$ (space group No. 4 of the International Tables for Crystallography), and the lattice constants a, b, and c were determined as follows: a=0.72516 nm; b=0.93431 nm; c=1.08761 nm; angle α=90°; β=104.489°; and γ=90°. Further, the atom positions were determined as shown in Table 1. Here, Si and Al exist in the equivalent atom positions with a certain ratio which should be determined by the composition thereof, and O and N exist in the equivalent atom positions with a certain ratio which should be determined by the composition thereof. Further, Sr has +2 valence, Al has +3 valence and Si has +4 valence, and therefore when atom positions and ratios of Sr, Al, and Si are found, a ratio of O to N occupying the positions of (O, N) can be determined from the condition of electrical neutrality of the crystal. The composition of the crystal obtained from Sr:Si:Al ratios having been measured by means of EDS and crystal structure data was found to be $Sr_1Si_3Al_2O_4N_4$. Further, a difference between the starting material composition and the crystal composition might has been caused by formation of a small amount of a second phase having a composition other than $Sr_1Si_3Al_2O_4N_4$. However, the analysis results show a structure of pure $Sr_1Si_3Al_2O_4N_4$ because the single crystal was used in the measurement.

When a similar composition thereof was examined, the $Sr_1Si_3Al_2O_4N_4$ crystal was found to allow Ba to substitute partially or entirely Sr while the crystal structure remains the same. More specifically, the crystal of $A_1Si_3Al_2N_4O_4$ (A is one or two kinds of elements (or mixture) selected from Sr and Ba) has a crystal structure identical to the crystal structure of the $Sr_1Si_3Al_2O_4N_4$ crystal. Further, with respect to the crystal, it was confirmed that Al could substitute partially Si, Si could substitute partially Al, and oxygen could substitute partially N, and that the crystal was one of the compositions of the crystal group having the same crystal structure as $Sr_1Si_3Al_2O_4N_4$ does. Further, the crystal can also be described as a composition represented by:

$$A_1Si_{3-x}Al_{2+x}O_{4+x}N_{4-x} \text{ (here, } -1 \leq x \leq 2\text{)},$$

from the condition of electrical neutrality.

From the crystal structure data, it was confirmed that the crystal was a new substance having not been reported so far. A powder X-ray diffraction pattern calculated from the crystal structure data is shown in FIG. 2. Hereafter, it is possible to determine the formation of the $Sr_1Si_3Al_2O_4N_4$ system crystal by performing a powder X-ray diffraction measurement of the synthesized product and comparing the measured powder X-ray diffraction pattern with that of FIG. 2 to find they are the same. Further, since the powder X-ray pattern can be calculated from values of the lattice constants obtained from the powder X-ray diffraction measurement and the crystal structure data of Table 1 with respect to what retains the same crystal structure as the $Sr_1Si_3Al_2O_4N_4$ system crystal and has the varied lattice constants, the formation of the $Sr_1Si_3Al_2O_4N_4$ system crystal can be judged by comparing the measured pattern with the calculated pattern.

Examples and Comparative Example of Phosphors;
Example 1 to Example 66

According to the design compositions as shown in Table 3, raw materials were weighed to be mixture compositions (molar ratios) as shown in Table 5. Here, conversion parameters using parameters to be the reference of the design composition are also summarized in Table 4. Meaning of these conversion parameters has been mentioned above. Although there may be a case in which a design composition in Table 3 and a corresponding mixture composition in Table 5 show difference in the composition depending on the kind of each raw material to be used, the mixture composition was determined such that the amount of each metal ion matches therebetween in such a case. Weighed raw material powders were mixed for 5 minutes using a pestle and a mortar made of silicon nitride sintered body. Then, the mixed powders were fed into a crucible made of boron nitride sintered body. A bulk density of the powder body was approximately from 20% to 30%.

The crucible containing the mixed powders was set into an electric furnace of a graphite resistance heating type. In the firing operation, first the firing atmosphere was made vacuum of $1 \times 10^{-1}$ Pa or less with a diffusion pump, the furnace was heated from the room temperature to 800° C. at a rate of 500° C. per hour, nitrogen of 99.999 vol % purity was introduced at 800° C. to raise the pressure to 1 MPa inside the furnace, the temperature was further raised to each firing temperature as shown in Table 6 at a rate of 500° C. per hour, and the temperature was maintained for each period of time as shown in Table 6.

TABLE 3

Design Compositions in Examples and Comparative Examples of Phosphor synthesis
Design compositions in examples and comparative examples of phosphor synthesis

| Example | | M element | A element | D element Si | E element Al | X element O | X element N | Composition formula parameters d | e | f | g | h |
|---|---|---|---|---|---|---|---|---|---|---|---|---|
| Comparative example | 1 | | 0.00 Sr | 1.00 | 3.0 | 2.0 | 4.0 | 4.0 | 0.0000 | 0.0714 | 0.2143 | 0.1429 | 0.5714 |
| Example | 2 | Eu | 0.02 Sr | 0.98 | 3.0 | 2.0 | 4.0 | 4.0 | 0.0014 | 0.0700 | 0.2143 | 0.1429 | 0.5714 |
| Example | 3 | Eu | 0.05 Sr | 0.95 | 3.0 | 2.0 | 4.0 | 4.0 | 0.0036 | 0.0679 | 0.2143 | 0.1429 | 0.5714 |
| Example | 4 | Eu | 0.05 Mg | 0.95 | 3.0 | 2.0 | 4.0 | 4.0 | 0.0036 | 0.0679 | 0.2143 | 0.1429 | 0.5714 |
| Example | 5 | Eu | 0.05 Ca | 0.95 | 3.0 | 2.0 | 4.0 | 4.0 | 0.0036 | 0.0679 | 0.2143 | 0.1429 | 0.5714 |
| Example | 6 | Eu | 0.05 Ba | 0.95 | 3.0 | 2.0 | 4.0 | 4.0 | 0.0036 | 0.0679 | 0.2143 | 0.1429 | 0.5714 |
| Example | 7 | Eu | 0.05 Sr, Ba | 0.95 | 3.0 | 2.0 | 4.0 | 4.0 | 0.0036 | 0.0679 | 0.2143 | 0.1429 | 0.5714 |
| Example | 8 | Eu | 0.05 Sr | 0.95 | 4.0 | 1.0 | 3.0 | 5.0 | 0.0036 | 0.0679 | 0.2857 | 0.0714 | 0.5714 |
| Example | 9 | Eu | 0.05 Sr | 0.95 | 3.5 | 1.5 | 3.5 | 4.5 | 0.0036 | 0.0679 | 0.2500 | 0.1071 | 0.5714 |
| Example | 10 | Eu | 0.05 Sr | 0.95 | 2.5 | 2.5 | 4.5 | 3.5 | 0.0036 | 0.0679 | 0.1786 | 0.1786 | 0.5714 |
| Example | 11 | Ce | 0.05 Sr | 0.95 | 3.0 | 2.0 | 4.0 | 4.0 | 0.0036 | 0.0679 | 0.2143 | 0.1429 | 0.5714 |
| Example | 12 | Pr | 0.05 Sr | 0.95 | 3.0 | 2.0 | 4.0 | 4.0 | 0.0036 | 0.0679 | 0.2143 | 0.1429 | 0.5714 |
| Example | 13 | Sm | 0.05 Sr | 0.95 | 3.0 | 2.0 | 4.0 | 4.0 | 0.0036 | 0.0679 | 0.2143 | 0.1429 | 0.5714 |
| Example | 14 | Gd | 0.05 Sr | 0.95 | 3.0 | 2.0 | 4.0 | 4.0 | 0.0036 | 0.0679 | 0.2143 | 0.1429 | 0.5714 |
| Example | 15 | Tb | 0.05 Sr | 0.95 | 3.0 | 2.0 | 4.0 | 4.0 | 0.0036 | 0.0679 | 0.2143 | 0.1429 | 0.5714 |
| Example | 16 | Dy | 0.05 Sr | 0.95 | 3.0 | 2.0 | 4.0 | 4.0 | 0.0036 | 0.0679 | 0.2143 | 0.1429 | 0.5714 |
| Example | 17 | Er | 0.05 Sr | 0.95 | 3.0 | 2.0 | 4.0 | 4.0 | 0.0036 | 0.0679 | 0.2143 | 0.1429 | 0.5714 |
| Example | 18 | Yb | 0.05 Sr | 0.95 | 3.0 | 2.0 | 4.0 | 4.0 | 0.0036 | 0.0679 | 0.2143 | 0.1429 | 0.5714 |
| Example | 19 | Ce, Eu | 0.05 Sr | 0.95 | 3.0 | 2.0 | 4.0 | 4.0 | 0.0036 | 0.0679 | 0.2143 | 0.1429 | 0.5714 |
| Example | 20 | Eu, Tb | 0.05 Sr | 0.95 | 3.0 | 2.0 | 4.0 | 4.0 | 0.0036 | 0.0679 | 0.2143 | 0.1429 | 0.5714 |
| Example | 21 | Eu | 0.05 Sr, Ba | 0.95 | 3.0 | 2.0 | 4.0 | 4.0 | 0.0036 | 0.0679 | 0.2143 | 0.1429 | 0.5714 |
| Example | 22 | Eu | 0.01 Sr, Ba | 0.99 | 3.0 | 2.0 | 4.0 | 4.0 | 0.0007 | 0.0707 | 0.2143 | 0.1429 | 0.5714 |
| Example | 23 | Eu | 0.03 Sr, Ba | 0.97 | 3.0 | 2.0 | 4.0 | 4.0 | 0.0021 | 0.0693 | 0.2143 | 0.1429 | 0.5714 |
| Example | 24 | Eu | 0.08 Sr, Ba | 0.92 | 3.0 | 2.0 | 4.0 | 4.0 | 0.0057 | 0.0657 | 0.2143 | 0.1429 | 0.5714 |
| Example | 25 | Eu | 0.12 Sr, Ba | 0.88 | 3.0 | 2.0 | 4.0 | 4.0 | 0.0086 | 0.0629 | 0.2143 | 0.1429 | 0.5714 |

TABLE 3-continued

Design Compositions in Examples and Comparative Examples of Phosphor synthesis
Design compositions in examples and comparative examples of phosphor synthesis

| Example | | M element | | A element | | D element Si | E element Al | X element O | N | Composition formula parameters d | e | f | g | h |
|---|---|---|---|---|---|---|---|---|---|---|---|---|---|---|
| Example | 26 | Eu | 0.03 | Sr | 0.97 | 3.0 | 2.0 | 4.0 | 4.0 | 0.0021 | 0.0693 | 0.2143 | 0.1429 | 0.5714 |
| Example | 27 | Eu | 0.03 | Sr, Ba | 0.97 | 3.0 | 2.0 | 4.0 | 4.0 | 0.0021 | 0.0693 | 0.2143 | 0.1429 | 0.5714 |
| Example | 28 | Eu | 0.03 | Sr, Ba | 0.97 | 3.0 | 2.0 | 4.0 | 4.0 | 0.0021 | 0.0693 | 0.2143 | 0.1429 | 0.5714 |
| Example | 29 | Eu | 0.03 | Sr, Ba | 0.97 | 3.0 | 2.0 | 4.0 | 4.0 | 0.0021 | 0.0693 | 0.2143 | 0.1429 | 0.5714 |
| Example | 30 | Eu | 0.03 | Sr, Ba | 0.97 | 3.0 | 2.0 | 4.0 | 4.0 | 0.0021 | 0.0693 | 0.2143 | 0.1429 | 0.5714 |
| Example | 31 | Eu | 0.03 | Sr, Ba | 0.97 | 3.0 | 2.0 | 4.0 | 4.0 | 0.0021 | 0.0693 | 0.2143 | 0.1429 | 0.5714 |
| Example | 32 | Eu | 0.03 | Ba | 0.97 | 3.0 | 2.0 | 4.0 | 4.0 | 0.0021 | 0.0693 | 0.2143 | 0.1429 | 0.5714 |
| Example | 33 | Eu | 0.05 | Ca, Sr | 0.95 | 3.0 | 2.0 | 4.0 | 4.0 | 0.0036 | 0.0679 | 0.2143 | 0.1429 | 0.5714 |
| Example | 34 | Eu | 0.05 | Ca, Ba | 0.95 | 3.0 | 2.0 | 4.0 | 4.0 | 0.0036 | 0.0679 | 0.2143 | 0.1429 | 0.5714 |
| Example | 35 | Eu | 0.05 | Sr, Ba | 0.95 | 4.0 | 1.0 | 3.0 | 5.0 | 0.0036 | 0.0679 | 0.2857 | 0.0714 | 0.5714 |
| Example | 36 | Eu | 0.05 | Sr, Ba | 0.95 | 3.5 | 1.5 | 3.5 | 4.5 | 0.0036 | 0.0679 | 0.2500 | 0.1071 | 0.5714 |
| Example | 37 | Eu | 0.05 | Sr, Ba | 0.95 | 3.0 | 2.0 | 4.0 | 4.0 | 0.0036 | 0.0679 | 0.2143 | 0.1429 | 0.5714 |
| Example | 38 | Eu | 0.05 | Sr, Ba | 0.95 | 2.5 | 2.5 | 4.5 | 3.5 | 0.0036 | 0.0679 | 0.1786 | 0.1786 | 0.5714 |
| Example | 39 | Eu | 0.05 | Sr, Ba | 0.95 | 2.0 | 3.0 | 5.0 | 3.0 | 0.0036 | 0.0679 | 0.1429 | 0.2143 | 0.5714 |
| Example | 40 | Eu | 0.05 | Sr, Ba | 0.95 | 1.0 | 4.0 | 6.0 | 2.0 | 0.0036 | 0.0679 | 0.0714 | 0.2857 | 0.5714 |
| Example | 41 | Eu | 0.05 | Sr, Ba | 0.95 | 3.0 | 2.0 | 4.0 | 4.0 | 0.0036 | 0.0679 | 0.2143 | 0.1429 | 0.5714 |
| Example | 42 | Eu | 0.01 | Sr, Ba | 0.99 | 3.0 | 2.0 | 4.0 | 4.0 | 0.0007 | 0.0707 | 0.2143 | 0.1429 | 0.5714 |
| Example | 43 | Eu | 0.03 | Sr, Ba | 0.97 | 3.0 | 2.0 | 4.0 | 4.0 | 0.0021 | 0.0693 | 0.2143 | 0.1429 | 0.5714 |
| Example | 44 | Eu | 0.08 | Sr, Ba | 0.92 | 3.0 | 2.0 | 4.0 | 4.0 | 0.0057 | 0.0657 | 0.2143 | 0.1429 | 0.5714 |
| Example | 45 | Eu | 0.12 | Sr, Ba | 0.88 | 3.0 | 2.0 | 4.0 | 4.0 | 0.0086 | 0.0629 | 0.2143 | 0.1429 | 0.5714 |
| Example | 46 | Eu | 0.03 | Sr | 0.97 | 3.0 | 2.0 | 4.0 | 4.0 | 0.0021 | 0.0693 | 0.2143 | 0.1429 | 0.5714 |
| Example | 47 | Eu | 0.03 | Sr, Ba | 0.97 | 3.0 | 2.0 | 4.0 | 4.0 | 0.0021 | 0.0693 | 0.2143 | 0.1429 | 0.5714 |
| Example | 48 | Eu | 0.03 | Sr, Ba | 0.97 | 3.0 | 2.0 | 4.0 | 4.0 | 0.0021 | 0.0693 | 0.2143 | 0.1429 | 0.5714 |
| Example | 49 | Eu | 0.03 | Sr, Ba | 0.97 | 3.0 | 2.0 | 4.0 | 4.0 | 0.0021 | 0.0693 | 0.2143 | 0.1429 | 0.5714 |
| Example | 50 | Eu | 0.03 | Sr, Ba | 0.97 | 3.0 | 2.0 | 4.0 | 4.0 | 0.0021 | 0.0693 | 0.2143 | 0.1429 | 0.5714 |
| Example | 51 | Eu | 0.03 | Sr, Ba | 0.97 | 3.0 | 2.0 | 4.0 | 4.0 | 0.0021 | 0.0693 | 0.2143 | 0.1429 | 0.5714 |
| Example | 52 | Eu | 0.03 | Ba | 0.97 | 3.0 | 2.0 | 4.0 | 4.0 | 0.0021 | 0.0693 | 0.2143 | 0.1429 | 0.5714 |
| Example | 53 | Eu | 0.05 | Ca, Sr | 0.95 | 3.0 | 2.0 | 4.0 | 4.0 | 0.0036 | 0.0679 | 0.2143 | 0.1429 | 0.5714 |
| Example | 54 | Eu | 0.05 | Ca, Ba | 0.95 | 3.0 | 2.0 | 4.0 | 4.0 | 0.0036 | 0.0679 | 0.2143 | 0.1429 | 0.5714 |
| Example | 55 | Eu | 0.05 | Sr, Ba | 0.95 | 4.0 | 1.0 | 3.0 | 5.0 | 0.0036 | 0.0679 | 0.2857 | 0.0714 | 0.5714 |
| Example | 56 | Eu | 0.05 | Sr, Ba | 0.95 | 3.5 | 1.5 | 3.5 | 4.5 | 0.0036 | 0.0679 | 0.2500 | 0.1071 | 0.5714 |
| Example | 57 | Eu | 0.05 | Sr, Ba | 0.95 | 3.0 | 2.0 | 4.0 | 4.0 | 0.0036 | 0.0679 | 0.2143 | 0.1429 | 0.5714 |
| Example | 58 | Eu | 0.05 | Sr, Ba | 0.95 | 2.5 | 2.5 | 4.5 | 3.5 | 0.0036 | 0.0679 | 0.1786 | 0.1786 | 0.5714 |
| Example | 59 | Eu | 0.05 | Sr, Ba | 0.95 | 2.0 | 3.0 | 5.0 | 3.0 | 0.0036 | 0.0679 | 0.1429 | 0.2143 | 0.5714 |
| Example | 60 | Eu | 0.05 | Sr, Ba | 0.95 | 1.0 | 4.0 | 6.0 | 2.0 | 0.0036 | 0.0679 | 0.0714 | 0.2857 | 0.5714 |
| Example | 61 | Eu | 0.05 | Sr | 0.85 | 3.0 | 2.0 | 4.2 | 3.8 | 0.0036 | 0.0612 | 0.2158 | 0.1439 | 0.5755 |
| Example | 62 | Eu | 0.05 | Sr | 0.90 | 3.0 | 2.0 | 4.1 | 3.9 | 0.0036 | 0.0645 | 0.2151 | 0.1434 | 0.5735 |
| Example | 63 | Eu | 0.05 | Sr | 0.95 | 3.0 | 2.0 | 4.0 | 4.0 | 0.0036 | 0.0679 | 0.2143 | 0.1429 | 0.5714 |
| Example | 64 | Eu | 0.05 | Sr | 1.00 | 3.0 | 2.0 | 3.9 | 4.1 | 0.0036 | 0.0712 | 0.2135 | 0.1423 | 0.5694 |
| Example | 65 | Eu | 0.05 | Sr | 1.05 | 3.0 | 2.0 | 3.8 | 4.2 | 0.0035 | 0.0745 | 0.2128 | 0.1418 | 0.5674 |
| Example | 66 | Eu | 0.05 | Sr | 1.15 | 3.0 | 2.0 | 3.6 | 4.4 | 0.0035 | 0.0810 | 0.2113 | 0.1408 | 0.5634 |

TABLE 4

Parameters' Conversion of Design Compositions in Examples
and Comparative Examples of Phosphor Synthesis
Parameters conversion of design compositions
in examples and comparative examples of phosphor synthesis

| Example | | (d + e)/(f + g) | d + e | f + g | f/(f + g) | h1/(h1 + h2) |
|---|---|---|---|---|---|---|
| Comparative example | 1 | 0.2000 | 0.0714 | 0.3571 | 0.6000 | 0.5000 |
| Example | 2 | 0.2000 | 0.0714 | 0.3571 | 0.6000 | 0.5000 |
| Example | 3 | 0.2000 | 0.0714 | 0.3571 | 0.6000 | 0.5000 |
| Example | 4 | 0.2000 | 0.0714 | 0.3571 | 0.6000 | 0.5000 |
| Example | 5 | 0.2000 | 0.0714 | 0.3571 | 0.6000 | 0.5000 |
| Example | 6 | 0.2000 | 0.0714 | 0.3571 | 0.6000 | 0.5000 |
| Example | 7 | 0.2000 | 0.0714 | 0.3571 | 0.6000 | 0.5000 |
| Example | 8 | 0.2000 | 0.0714 | 0.3571 | 0.8000 | 0.3750 |
| Example | 9 | 0.2000 | 0.0714 | 0.3571 | 0.7000 | 0.4375 |
| Example | 10 | 0.2000 | 0.0714 | 0.3571 | 0.5000 | 0.5625 |
| Example | 11 | 0.2000 | 0.0714 | 0.3571 | 0.6000 | 0.5000 |
| Example | 12 | 0.2000 | 0.0714 | 0.3571 | 0.6000 | 0.5000 |
| Example | 13 | 0.2000 | 0.0714 | 0.3571 | 0.6000 | 0.5000 |
| Example | 14 | 0.2000 | 0.0714 | 0.3571 | 0.6000 | 0.5000 |
| Example | 15 | 0.2000 | 0.0714 | 0.3571 | 0.6000 | 0.5000 |
| Example | 16 | 0.2000 | 0.0714 | 0.3571 | 0.6000 | 0.5000 |
| Example | 17 | 0.2000 | 0.0714 | 0.3571 | 0.6000 | 0.5000 |
| Example | 18 | 0.2000 | 0.0714 | 0.3571 | 0.6000 | 0.5000 |
| Example | 19 | 0.2000 | 0.0714 | 0.3571 | 0.6000 | 0.5000 |
| Example | 20 | 0.2000 | 0.0714 | 0.3571 | 0.6000 | 0.5000 |
| Example | 21 | 0.2000 | 0.0714 | 0.3571 | 0.6000 | 0.5000 |
| Example | 22 | 0.2000 | 0.0714 | 0.3571 | 0.6000 | 0.5000 |
| Example | 23 | 0.2000 | 0.0714 | 0.3571 | 0.6000 | 0.5000 |
| Example | 24 | 0.2000 | 0.0714 | 0.3571 | 0.6000 | 0.5000 |
| Example | 25 | 0.2000 | 0.0714 | 0.3571 | 0.6000 | 0.5000 |
| Example | 26 | 0.2000 | 0.0714 | 0.3571 | 0.6000 | 0.5000 |
| Example | 27 | 0.2000 | 0.0714 | 0.3571 | 0.6000 | 0.5000 |
| Example | 28 | 0.2000 | 0.0714 | 0.3571 | 0.6000 | 0.5000 |
| Example | 29 | 0.2000 | 0.0714 | 0.3571 | 0.6000 | 0.5000 |
| Example | 30 | 0.2000 | 0.0714 | 0.3571 | 0.6000 | 0.5000 |
| Example | 31 | 0.2000 | 0.0714 | 0.3571 | 0.6000 | 0.5000 |
| Example | 32 | 0.2000 | 0.0714 | 0.3571 | 0.6000 | 0.5000 |
| Example | 33 | 0.2000 | 0.0714 | 0.3571 | 0.6000 | 0.5000 |

TABLE 4-continued

Parameters' Conversion of Design Compositions in Examples
and Comparative Examples of Phosphor Synthesis
Parameters conversion of design compositions
in examples and comparative examples of phosphor synthesis

| Example | (d + e)/(f + g) | d + e | f + g | f/(f + g) | h1/(h1 + h2) |
|---|---|---|---|---|---|
| Example 34 | 0.2000 | 0.0714 | 0.3571 | 0.6000 | 0.5000 |
| Example 35 | 0.2000 | 0.0714 | 0.3571 | 0.8000 | 0.3750 |
| Example 36 | 0.2000 | 0.0714 | 0.3571 | 0.7000 | 0.4375 |
| Example 37 | 0.2000 | 0.0714 | 0.3571 | 0.6000 | 0.5000 |
| Example 38 | 0.2000 | 0.0714 | 0.3571 | 0.5000 | 0.5625 |
| Example 39 | 0.2000 | 0.0714 | 0.3571 | 0.4000 | 0.6250 |
| Example 40 | 0.2000 | 0.0714 | 0.3571 | 0.2000 | 0.7500 |
| Example 41 | 0.2000 | 0.0714 | 0.3571 | 0.6000 | 0.5000 |
| Example 42 | 0.2000 | 0.0714 | 0.3571 | 0.6000 | 0.5000 |
| Example 43 | 0.2000 | 0.0714 | 0.3571 | 0.6000 | 0.5000 |
| Example 44 | 0.2000 | 0.0714 | 0.3571 | 0.6000 | 0.5000 |
| Example 45 | 0.2000 | 0.0714 | 0.3571 | 0.6000 | 0.5000 |
| Example 46 | 0.2000 | 0.0714 | 0.3571 | 0.6000 | 0.5000 |
| Example 47 | 0.2000 | 0.0714 | 0.3571 | 0.6000 | 0.5000 |
| Example 48 | 0.2000 | 0.0714 | 0.3571 | 0.6000 | 0.5000 |
| Example 49 | 0.2000 | 0.0714 | 0.3571 | 0.6000 | 0.5000 |
| Example 50 | 0.2000 | 0.0714 | 0.3571 | 0.6000 | 0.5000 |
| Example 51 | 0.2000 | 0.0714 | 0.3571 | 0.6000 | 0.5000 |
| Example 52 | 0.2000 | 0.0714 | 0.3571 | 0.6000 | 0.5000 |
| Example 53 | 0.2000 | 0.0714 | 0.3571 | 0.6000 | 0.5000 |
| Example 54 | 0.2000 | 0.0714 | 0.3571 | 0.6000 | 0.5000 |
| Example 55 | 0.2000 | 0.0714 | 0.3571 | 0.8000 | 0.3750 |
| Example 56 | 0.2000 | 0.0714 | 0.3571 | 0.7000 | 0.4375 |
| Example 57 | 0.2000 | 0.0714 | 0.3571 | 0.6000 | 0.5000 |
| Example 58 | 0.2000 | 0.0714 | 0.3571 | 0.5000 | 0.5625 |
| Example 59 | 0.2000 | 0.0714 | 0.3571 | 0.4000 | 0.6250 |
| Example 60 | 0.2000 | 0.0714 | 0.3571 | 0.2000 | 0.7500 |
| Example 61 | 0.1800 | 0.0647 | 0.3597 | 0.6000 | 0.5250 |
| Example 62 | 0.1900 | 0.0681 | 0.3584 | 0.6000 | 0.5125 |
| Example 63 | 0.2000 | 0.0714 | 0.3571 | 0.6000 | 0.5000 |
| Example 64 | 0.2100 | 0.0747 | 0.3559 | 0.6000 | 0.4875 |
| Example 65 | 0.2200 | 0.0780 | 0.3546 | 0.6000 | 0.4750 |
| Example 66 | 0.2400 | 0.0845 | 0.3521 | 0.6000 | 0.4500 |

TABLE 5

Mixture Composition of Raw Material in Examples and Comparative
Examples of Phosphor Synthesis
Mixture composition of raw material
in examples and comparative examples of phosphor synthesis

| Example | Si3N4 | SiO2 | AlN | Al2O3 | MgO | CaO | SrO | BaO | M oxide, M nitride | |
|---|---|---|---|---|---|---|---|---|---|---|
| Comparative example 1 | 1.000 | | | 1.000 | | | 1.000 | | | 0.000 |
| Example 2 | 1.000 | | 0.007 | 0.997 | | | 0.980 | | Eu2O3 | 0.010 |
| Example 3 | 1.000 | | 0.017 | 0.992 | | | 0.950 | | Eu2O3 | 0.025 |
| Example 4 | 1.000 | | 0.017 | 0.992 | 0.950 | | | | Eu2O3 | 0.025 |
| Example 5 | 1.000 | | 0.017 | 0.992 | | 0.950 | | | Eu2O3 | 0.025 |
| Example 6 | 1.000 | | 0.017 | 0.992 | | | | 0.950 | Eu2O3 | 0.025 |
| Example 7 | 1.000 | | 0.017 | 0.992 | | | 0.475 | 0.475 | Eu2O3 | 0.025 |
| Example 8 | 1.333 | | | 0.658 | | | 0.950 | | Eu2O3 | 0.025 |
| Example 9 | 1.167 | | | 0.825 | | | 0.950 | | Eu2O3 | 0.025 |
| Example 10 | 0.833 | | 0.183 | 1.158 | | | 0.950 | | Eu2O3 | 0.025 |
| Example 11 | 1.000 | | 0.017 | 0.992 | | | 0.950 | | CeO2 | 0.050 |
| Example 12 | 1.000 | | 0.017 | 0.992 | | | 0.950 | | Pr6O11 | 0.008 |
| Example 13 | 1.000 | | 0.017 | 0.992 | | | 0.950 | | Sm2O3 | 0.025 |
| Example 14 | 1.000 | | 0.017 | 0.992 | | | 0.950 | | Gd2O3 | 0.025 |
| Example 15 | 1.000 | | 0.017 | 0.992 | | | 0.950 | | Tb4O7 | 0.013 |
| Example 16 | 1.000 | | 0.017 | 0.992 | | | 0.950 | | Dy2O3 | 0.025 |
| Example 17 | 1.000 | | 0.017 | 0.992 | | | 0.950 | | Er2O3 | 0.025 |
| Example 18 | 1.000 | | 0.017 | 0.992 | | | 0.950 | | Yb2O3 | 0.025 |
| Example 19 | 1.000 | | 0.017 | 0.992 | | | 0.950 | | CeO2 0.025 Eu2O3 | 0.013 |
| Example 20 | 1.000 | | 0.017 | 0.992 | | | 0.950 | | Eu2O3 0.013 Tb4O7 | 0.006 |
| Example 21 | 1.000 | | 0.017 | 0.992 | | | 0.475 | 0.475 | Eu2O3 | 0.025 |
| Example 22 | 1.000 | | 0.003 | 0.998 | | | 0.495 | 0.495 | Eu2O3 | 0.005 |
| Example 23 | 1.000 | | 0.010 | 0.995 | | | 0.485 | 0.485 | Eu2O3 | 0.015 |
| Example 24 | 1.000 | | 0.027 | 0.987 | | | 0.460 | 0.460 | Eu2O3 | 0.040 |
| Example 25 | 1.000 | | 0.040 | 0.980 | | | 0.440 | 0.440 | Eu2O3 | 0.060 |
| Example 26 | 1.000 | | 0.010 | 0.995 | | | 0.970 | | Eu2O3 | 0.015 |
| Example 27 | 1.000 | | 0.010 | 0.995 | | | 0.873 | 0.097 | Eu2O3 | 0.015 |
| Example 28 | 1.000 | | 0.010 | 0.995 | | | 0.679 | 0.291 | Eu2O3 | 0.015 |
| Example 29 | 1.000 | | 0.010 | 0.995 | | | 0.485 | 0.485 | Eu2O3 | 0.015 |
| Example 30 | 1.000 | | 0.010 | 0.995 | | | 0.291 | 0.679 | Eu2O3 | 0.015 |
| Example 31 | 1.000 | | 0.010 | 0.995 | | | 0.097 | 0.873 | Eu2O3 | 0.015 |
| Example 32 | 1.000 | | 0.010 | 0.995 | | | | 0.970 | Eu2O3 | 0.015 |
| Example 33 | 1.000 | | 0.017 | 0.992 | | 0.475 | 0.475 | | Eu2O3 | 0.025 |
| Example 34 | 1.000 | | 0.017 | 0.992 | | 0.475 | | 0.475 | Eu2O3 | 0.025 |
| Example 35 | 1.004 | 0.988 | 1.000 | | | | 0.475 | 0.475 | Eu2O3 | 0.025 |
| Example 36 | 0.754 | 1.238 | 1.500 | | | | 0.475 | 0.475 | Eu2O3 | 0.025 |
| Example 37 | 1.000 | | 0.017 | 0.992 | | | 0.475 | 0.475 | Eu2O3 | 0.025 |
| Example 38 | 0.833 | | 0.183 | 1.158 | | | 0.475 | 0.475 | Eu2O3 | 0.025 |
| Example 39 | 0.667 | | 0.350 | 1.325 | | | 0.475 | 0.475 | Eu2O3 | 0.025 |
| Example 40 | 0.333 | | 0.683 | 1.658 | | | 0.475 | 0.475 | Eu2O3 | 0.025 |

TABLE 5-continued

Mixture Composition of Raw Material in Examples and Comparative Examples of Phosphor Synthesis
Mixture composition of raw material in examples and comparative examples of phosphor synthesis

| Example | | Si3N4 | SiO2 | AlN | Al2O3 | MgO | CaO | SrO | BaO | M oxide, M nitride | |
|---|---|---|---|---|---|---|---|---|---|---|---|
| Example | 41 | 1.000 | | 0.017 | 0.992 | | | 0.475 | 0.475 | Eu2O3 | 0.025 |
| Example | 42 | 1.000 | | 0.003 | 0.998 | | | 0.495 | 0.495 | Eu2O3 | 0.005 |
| Example | 43 | 1.000 | | 0.010 | 0.995 | | | 0.485 | 0.485 | Eu2O3 | 0.015 |
| Example | 44 | 1.000 | | 0.027 | 0.987 | | | 0.460 | 0.460 | Eu2O3 | 0.040 |
| Example | 45 | 1.000 | | 0.040 | 0.980 | | | 0.440 | 0.440 | Eu2O3 | 0.060 |
| Example | 46 | 1.000 | | 0.010 | 0.995 | | | 0.970 | | Eu2O3 | 0.015 |
| Example | 47 | 1.000 | | 0.010 | 0.995 | | | 0.873 | 0.097 | Eu2O3 | 0.015 |
| Example | 48 | 1.000 | | 0.010 | 0.995 | | | 0.679 | 0.291 | Eu2O3 | 0.015 |
| Example | 49 | 1.000 | | 0.010 | 0.995 | | | 0.485 | 0.485 | Eu2O3 | 0.015 |
| Example | 50 | 1.000 | | 0.010 | 0.995 | | | 0.291 | 0.679 | Eu2O3 | 0.015 |
| Example | 51 | 1.000 | | 0.010 | 0.995 | | | 0.097 | 0.873 | Eu2O3 | 0.015 |
| Example | 52 | 1.000 | | 0.010 | 0.995 | | | | 0.970 | Eu2O3 | 0.015 |
| Example | 53 | 1.000 | | 0.017 | 0.992 | | 0.475 | 0.475 | | Eu2O3 | 0.025 |
| Example | 54 | 1.000 | | 0.017 | 0.992 | 0.475 | | | 0.475 | Eu2O3 | 0.025 |
| Example | 55 | 1.004 | 0.988 | 1.000 | | | | 0.475 | 0.475 | Eu2O3 | 0.025 |
| Example | 56 | 0.754 | 1.238 | 1.500 | | | | 0.475 | 0.475 | Eu2O3 | 0.025 |
| Example | 57 | 1.000 | | 0.017 | 0.992 | | | 0.475 | 0.475 | Eu2O3 | 0.025 |
| Example | 58 | 0.833 | | 0.183 | 1.158 | | | 0.475 | 0.475 | Eu2O3 | 0.025 |
| Example | 59 | 0.667 | | 0.350 | 1.325 | | | 0.475 | 0.475 | Eu2O3 | 0.025 |
| Example | 60 | 0.333 | | 0.683 | 1.658 | | | 0.475 | 0.475 | Eu2O3 | 0.025 |
| Example | 61 | 0.950 | 0.150 | | 1.000 | | | 0.850 | | EuO | 0.050 |
| Example | 62 | 0.975 | 0.075 | | 1.000 | | | 0.900 | | EuO | 0.050 |
| Example | 63 | 1.000 | | | 1.000 | | | 0.950 | | EuO | 0.050 |
| Example | 64 | 1.000 | | 0.100 | 0.950 | | | 1.000 | | EuO | 0.050 |
| Example | 65 | 1.000 | | 0.200 | 0.900 | | | 1.050 | | EuO | 0.050 |
| Example | 66 | 1.000 | | 0.400 | 0.900 | | | 1.150 | | EuO | 0.050 |

TABLE 6

Firing Conditions in Examples and Comparative Examples of Phosphor Synthesis
Firing conditions in examples and comparative examples of phosphor synthesis

| Example | | Temperature (° C.) | Time |
|---|---|---|---|
| Comparative example | 1 | 1600 | 2 |
| Example | 2 | 1600 | 2 |
| Example | 3 | 1600 | 2 |
| Example | 4 | 1600 | 2 |
| Example | 5 | 1600 | 2 |
| Example | 6 | 1600 | 2 |
| Example | 7 | 1600 | 2 |
| Example | 8 | 1600 | 2 |
| Example | 9 | 1600 | 2 |
| Example | 10 | 1600 | 2 |
| Example | 11 | 1600 | 2 |
| Example | 12 | 1600 | 2 |
| Example | 13 | 1600 | 2 |
| Example | 14 | 1600 | 2 |
| Example | 15 | 1600 | 2 |
| Example | 16 | 1600 | 2 |
| Example | 17 | 1600 | 2 |
| Example | 18 | 1600 | 2 |
| Example | 19 | 1600 | 2 |
| Example | 20 | 1600 | 2 |
| Example | 21 | 1600 | 2 |
| Example | 22 | 1600 | 2 |
| Example | 23 | 1600 | 2 |
| Example | 24 | 1600 | 2 |
| Example | 25 | 1600 | 2 |
| Example | 26 | 1600 | 2 |
| Example | 27 | 1600 | 2 |
| Example | 28 | 1600 | 2 |
| Example | 29 | 1600 | 2 |
| Example | 30 | 1600 | 2 |
| Example | 31 | 1600 | 2 |
| Example | 32 | 1600 | 2 |
| Example | 33 | 1600 | 2 |
| Example | 34 | 1600 | 2 |
| Example | 35 | 1600 | 2 |
| Example | 36 | 1600 | 2 |
| Example | 37 | 1600 | 2 |
| Example | 38 | 1600 | 2 |
| Example | 39 | 1600 | 2 |
| Example | 40 | 1600 | 2 |
| Example | 41 | 1600 | 6 |
| Example | 42 | 1600 | 6 |
| Example | 43 | 1600 | 6 |
| Example | 44 | 1600 | 6 |
| Example | 45 | 1600 | 6 |
| Example | 46 | 1600 | 6 |
| Example | 47 | 1600 | 6 |
| Example | 48 | 1600 | 6 |
| Example | 49 | 1600 | 6 |
| Example | 50 | 1600 | 6 |
| Example | 51 | 1600 | 6 |
| Example | 52 | 1600 | 6 |
| Example | 53 | 1600 | 6 |
| Example | 54 | 1600 | 6 |
| Example | 55 | 1600 | 6 |
| Example | 56 | 1600 | 6 |
| Example | 57 | 1600 | 6 |
| Example | 58 | 1600 | 6 |
| Example | 59 | 1600 | 2 |

TABLE 6-continued

Firing Conditions in Examples and Comparative Examples of Phosphor Synthesis
Firing conditions in examples and comparative examples of phosphor synthesis

| Example | | Firing conditions | |
|---|---|---|---|
| | | Temperature (° C.) | Time |
| Example | 60 | 1600 | 2 |
| Example | 61 | 1700 | 2 |
| Example | 62 | 1700 | 2 |
| Example | 63 | 1700 | 2 |
| Example | 64 | 1700 | 2 |
| Example | 65 | 1700 | 2 |
| Example | 66 | 1700 | 2 |

Next, each synthesized compound was ground using an agate mortar and the powder X-ray diffraction measurement using Cu Kα-line was carried out. Main formation phases are shown in Table 7. As a result, it was confirmed that a phase having a crystal structure identical to the crystal structure of the $Sr_1Si_3Al_2O_4N_4$ crystal was the main formation phases. With respect to the formation phase, it is described in more detail later. Further, it was confirmed that the synthesized material included a rare earth element, an alkaline earth metal, Si, Al, O, and N by the measurement of EDS. That is, it was confirmed that the synthesized material was a phosphor in which a light-emitting ion M such as Eu and Ce was solid-solved into the $Sr_1Si_3Al_2O_4N_4$ system crystal.

TABLE 7

Main Formation Phases in Examples and Comparative Examples of Phosphor Synthesis
Main formation phases in examples and comparative examples of phosphor synthesis

| Example | | Crystal structures of Main formation phases |
|---|---|---|
| Comparative example | 1 | Crystal structures of Main formation phases |
| Example | 2 | Crystal structure identical to that of Sr1Si3Al2O4N4 |
| Example | 3 | Crystal structure identical to that of Sr1Si3Al2O4N4 |
| Example | 4 | Crystal structure identical to that of Sr1Si3Al2O4N4 |
| Example | 5 | Crystal structure identical to that of Sr1Si3Al2O4N4 |
| Example | 6 | Crystal structure identical to that of Sr1Si3Al2O4N4 |
| Example | 7 | Crystal structure identical to that of Sr1Si3Al2O4N4 |
| Example | 8 | Crystal structure identical to that of Sr1Si3Al2O4N4 |
| Example | 9 | Crystal structure identical to that of Sr1Si3Al2O4N4 |
| Example | 10 | Crystal structure identical to that of Sr1Si3Al2O4N4 |
| Example | 11 | Crystal structure identical to that of Sr1Si3Al2O4N4 |
| Example | 12 | Crystal structure identical to that of Sr1Si3Al2O4N4 |
| Example | 13 | Crystal structure identical to that of Sr1Si3Al2O4N4 |
| Example | 14 | Crystal structure identical to that of Sr1Si3Al2O4N4 |
| Example | 15 | Crystal structure identical to that of Sr1Si3Al2O4N4 |
| Example | 16 | Crystal structure identical to that of Sr1Si3Al2O4N4 |
| Example | 17 | Crystal structure identical to that of Sr1Si3Al2O4N4 |
| Example | 18 | Crystal structure identical to that of Sr1Si3Al2O4N4 |
| Example | 19 | Crystal structure identical to that of Sr1Si3Al2O4N4 |
| Example | 20 | Crystal structure identical to that of Sr1Si3Al2O4N4 |
| Example | 21 | Crystal structure identical to that of Sr1Si3Al2O4N4 |
| Example | 22 | Crystal structure identical to that of Sr1Si3Al2O4N4 |
| Example | 23 | Crystal structure identical to that of Sr1Si3Al2O4N4 |
| Example | 24 | Crystal structure identical to that of Sr1Si3Al2O4N4 |
| Example | 25 | Crystal structure identical to that of Sr1Si3Al2O4N4 |
| Example | 26 | Crystal structure identical to that of Sr1Si3Al2O4N4 |
| Example | 27 | Crystal structure identical to that of Sr1Si3Al2O4N4 |
| Example | 28 | Crystal structure identical to that of Sr1Si3Al2O4N4 |
| Example | 29 | Crystal structure identical to that of Sr1Si3Al2O4N4 |
| Example | 30 | Crystal structure identical to that of Sr1Si3Al2O4N4 |
| Example | 31 | Crystal structure identical to that of Sr1Si3Al2O4N4 |
| Example | 32 | Crystal structure identical to that of Sr1Si3Al2O4N4 |
| Example | 33 | Crystal structure identical to that of Sr1Si3Al2O4N4 |
| Example | 34 | Crystal structure identical to that of Sr1Si3Al2O4N4 |
| Example | 35 | Crystal structure identical to that of Sr1Si3Al2O4N4 |
| Example | 36 | Crystal structure identical to that of Sr1Si3Al2O4N4 |
| Example | 37 | Crystal structure identical to that of Sr1Si3Al2O4N4 |
| Example | 38 | Crystal structure identical to that of Sr1Si3Al2O4N4 |
| Example | 39 | Crystal structure identical to that of Sr1Si3Al2O4N4 |
| Example | 40 | Crystal structure identical to that of Sr1Si3Al2O4N4 |
| Example | 41 | Crystal structure identical to that of Sr1Si3Al2O4N4 |
| Example | 42 | Crystal structure identical to that of Sr1Si3Al2O4N4 |
| Example | 43 | Crystal structure identical to that of Sr1Si3Al2O4N4 |
| Example | 44 | Crystal structure identical to that of Sr1Si3Al2O4N4 |
| Example | 45 | Crystal structure identical to that of Sr1Si3Al2O4N4 |
| Example | 46 | Crystal structure identical to that of Sr1Si3Al2O4N4 |
| Example | 47 | Crystal structure identical to that of Sr1Si3Al2O4N4 |
| Example | 48 | Crystal structure identical to that of Sr1Si3Al2O4N4 |
| Example | 49 | Crystal structure identical to that of Sr1Si3Al2O4N4 |
| Example | 50 | Crystal structure identical to that of Sr1Si3Al2O4N4 |
| Example | 51 | Crystal structure identical to that of Sr1Si3Al2O4N4 |
| Example | 52 | Crystal structure identical to that of Sr1Si3Al2O4N4 |
| Example | 53 | Crystal structure identical to that of Sr1Si3Al2O4N4 |
| Example | 54 | Crystal structure identical to that of Sr1Si3Al2O4N4 |
| Example | 55 | Crystal structure identical to that of Sr1Si3Al2O4N4 |
| Example | 56 | Crystal structure identical to that of Sr1Si3Al2O4N4 |
| Example | 57 | Crystal structure identical to that of Sr1Si3Al2O4N4 |
| Example | 58 | Crystal structure identical to that of Sr1Si3Al2O4N4 |
| Example | 59 | Crystal structure identical to that of Sr1Si3Al2O4N4 |
| Example | 60 | Crystal structure identical to that of Sr1Si3Al2O4N4 |
| Example | 61 | Crystal structure identical to that of Sr1Si3Al2O4N8 |
| Example | 62 | Crystal structure identical to that of Sr1Si3Al2O4N8 |
| Example | 63 | Crystal structure identical to that of Sr1Si3Al2O4N8 |
| Example | 64 | Crystal structure identical to that of Sr1Si3Al2O4N8 |
| Example | 65 | Crystal structure identical to that of Sr1Si3Al2O4N8 |
| Example | 66 | Crystal structure identical to that of Sr1Si3Al2O4N8 |

After firing, the obtained firing products were crushed coarsely and further ground by hand using a crucible and mortar made of silicon nitride sintered body, and then allowed to pass a 30 μm-mesh sieve. When the particle size distribution was measured, the mean particle diameter was 3 to 8 μm.

Here, a portion in which a raw material mixture composition and a chemical composition of the synthesized product show discrepancy has a trace amount of substance mixed in the synthesized product as an impurity secondary phase.

FIGS. 4 to 17 are diagrams showing the results of powder X-ray diffraction of the phosphors synthesized in Examples 2, 7, 8, 9, 21, 25, 26, 32, 36, 41, 46, 52, 56 and 57, respectively. In any of the diagrams, the powder X-ray diffraction pattern of the $Sr_1Si_3Al_2O_4N_4$ crystal as shown in FIG. 2 is included such that it can be confirmed that a phase having a crystal structure identical to that of the $Sr_1Si_3Al_2O_4N_4$ crystal was the main formation phase in each case. In this way, if a powder X-ray diffraction pattern of an obtained phosphor includes the powder X-ray diffraction pattern as shown in FIG. 2, it can be confirmed that there exists an inorganic crystal comprising the crystal represented by $Sr_1Si_3Al_2O_4N_4$ according to the present invention. Since the powder X-ray diffraction pattern is shifted as the inter-plane distance d differs in accordance with $n\lambda=2d\cdot\sin\theta$ even if the substance has the identical crystal structure, even the shifted powder X-ray diffraction pattern (shift by the θ) belongs to the powder X-ray diffraction pattern of the $Sr_1Si_3Al_2O_4N_4$ crystal as shown in FIG. 2. Further, since it is known that widening (narrowing) width of the diffraction line occurs in accordance with the size difference of respective crystallites, a powder X-ray diffraction pattern having a wide or narrow width of the diffraction line may also belong to the powder X-ray diffraction pattern of the $Sr_1Si_3Al_2O_4N_4$ crystal as shown in FIG. 2. In particular, solid-solution of an element to cause the crystal to emit fluorescence to be mentioned later can be a factor for changing the inter-plane distance and may change the size of the crystallite such that the width of the diffraction line can be changed. Concretely, it can be said that the inorganic crystal including the crystal represented by $Sr_1Si_3Al_2O_4N_4$ or an inorganic crystal having a crystal structure identical to that of the crystal represented by $Sr_1Si_3Al_2O_4N_4$ is included in all samples from FIGS. 4 to 17. Further, the amount of the inorganic crystal can be measured by a commercially available program. The results in which the quantity of each crystal phase was determined in such a manner are summarized in Table 8.

Example 21. Similar emission spectra were confirmed in a similar manner for all of the phosphors in the other Examples. And, since the $Sr_1Si_3Al_2O_4N_4$ crystal per se does not include the fluorescent component, it is not a phosphor in itself (refer to Comparative Examples 7 and 9 in Table 3). Therefore, the emission spectrum of FIG. 18 cannot be obtained. That is to say, it is possible to confirm the formation of a phosphor including an inorganic compound in which the M element (here, M is one or two or more kinds of elements selected from Mn, Ce, Pr, Nd, Sm, Eu, Tb, Dy, and Yb) is solid-solved into the inorganic crystal comprising the crystal represented by $Sr_1Si_3Al_2O_4N_4$ or the inorganic crystal having the crystal structure identical to that of the crystal represented by

TABLE 8

Constituent Phases in Examples of Phosphor Synthesis
Constituent phases in examples of phosphor synthesis

| Example | Crystal designated by Sr1Si3Al2O4N4 or inorganic crystal having the same crystal structure as Sr1Si3Al2O4N4 (present phosphor). | Sr3Si8O7N8 | β-Si3N4 | α-sialon | SrSi2O2N2 | SrSi7N10 | Sr2Si5N8 |
|---|---|---|---|---|---|---|---|
| Example 2 | 86 | 14 | | | | | |
| Example 7 | 100 | | | | | | |
| Example 8 | 34 | 38 | 28 | | | | |
| Example 9 | 54 | 46 | | | | | |
| Example 25 | 96 | | | | | 1 | 3 |
| Example 26 | 68 | | | 10 | 21 | | 1 |
| Example 32 | 87 | | | | 13 | | |
| Example 36 | 35 | | 40 | 23 | | 2 | |
| Example 41 | 94 | | | | | | 3 |
| Example 46 | 87 | | | 4 | 5 | | 4 |
| Example 52 | 90 | | | | | | |
| Example 56 | 46 | 33 | | 21 | | | |
| Example 57 | 99 | | 1 | | | | |
| Example 61 | 64 | | 36 | | | | |
| Example 62 | 84 | | 15 | | 1 | | |
| Example 63 | 98 | | | | | | 2 |
| Example 64 | 98 | | | | | | |
| Example 65 | 92 | | | | | | |
| Example 66 | 68 | | | | | | |

| Example | SrAl2O4 | SrSi2N5 | SrAl2Si2O8 | Sr3Si8O7N8 | Eu2Si5N8 | SrSiAl2N2O3 |
|---|---|---|---|---|---|---|
| Example 2 | | | | | | |
| Example 7 | | | | | | |
| Example 8 | | | | | | |
| Example 9 | | | | | | |
| Example 25 | | | | | | |
| Example 26 | | | | | | |
| Example 32 | | | | | | |
| Example 36 | | | | | | |
| Example 41 | 3 | | | | | |
| Example 46 | | | | | | |
| Example 52 | | 8 | 2 | | | |
| Example 56 | | | | | | |
| Example 57 | | | | | | |
| Example 61 | | | | | | |
| Example 62 | | | | | | |
| Example 63 | | | | | | |
| Example 64 | | | | | 2 | |
| Example 65 | | | | | | 8 |
| Example 66 | | | | 5 | | 27 |

As is clear from Table 8, the phosphor of the present invention includes at least 20 mass % or more of the $Sr_1Si_3Al_2O_4N_4$ crystal of the present invention or the crystal having the crystal structure identical to that of the $Sr_1Si_3Al_2O_4N_4$ crystal, each of which is recognized to be the main formation phase.

Figure 18:
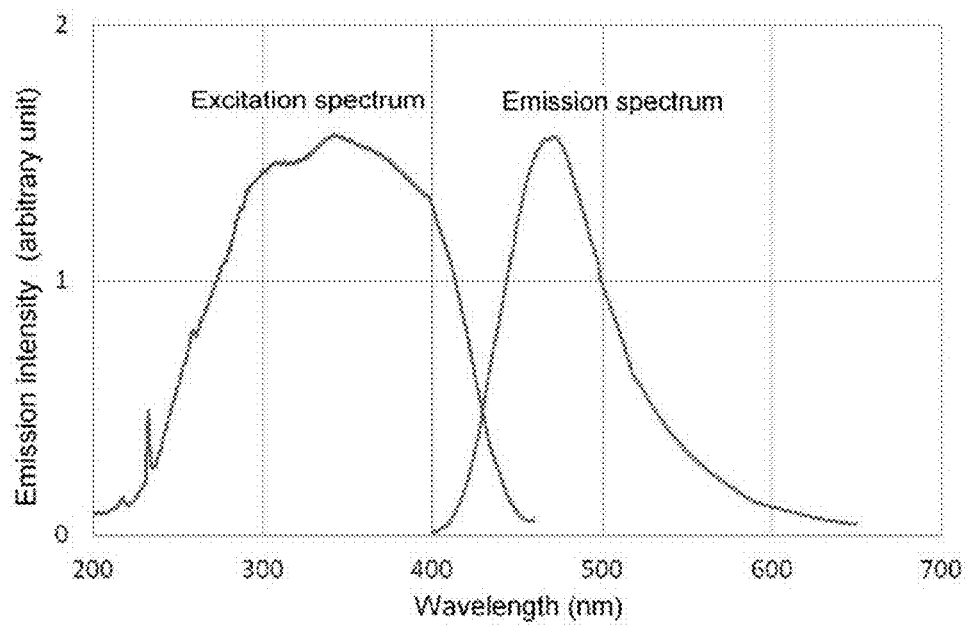
FIG. 18 is a diagram showing an excitation spectrum and an emission spectrum of a phosphor synthesized in Example 21.

FIG. 18 is a diagram showing an excitation spectrum and an emission spectrum of the phosphor synthesized in $Sr_1Si_3Al_2O_4N_4$, from detection of the $Sr_1Si_3Al_2O_4N_4$ crystal or the inorganic compound having the identical crystal structure thereto, detection of an element to become a fluorescent component, and presence of a specific emission spectrum to be mentioned later.

The results of powder X-ray diffraction of the synthesized phosphors (FIGS. 4 to 17) show a good agreement with the results of structure analysis (FIGS. 2 and 3). In particular, in Example 21, the measured X-ray diffraction pattern is identical to that of the $Sr_1Si_3Al_2O_4N_4$ crystal, and the crystal having the crystal structure identical to that of the $Sr_1Si_3Al_2O_4N_4$ crystal was confirmed to be the main component. Further, in Example 21, the synthesized material was confirmed to include Eu, Sr, Ba, Si, Al, O, and N from the measurement by means of EDS. In addition, the ratios of Sr:Ba:Si:Al were confirmed to be 0.5:0.5:3:2. That is, the synthesized material was confirmed to be a phosphor in which Eu is solid-solved into the $Sr_{0.5}Ba_{0.5}Si_3Al_2N_4O_4$ crystal. In Example 21, the phosphor was found to allow excitation at 343 nm most efficiently, and the emission spectrum was found to emit light having a peak at 472 nm when the phosphor was excited at 343 nm. Further, an emission color of the phosphor of Example 21 was confirmed to be within the following range:

$0.05 \leq x \leq 0.3$; and $0.02 \leq y \leq 0.4$ in the CIE 1931 chromaticity coordinates.

These powders were irradiated with light from a lamp to emit light having a wavelength of 365 nm, and as a result, the synthesized materials were confirmed to emit light of a blue color to a red color. An emission spectrum and an excitation spectrum of the powder were measured using a spectrophotofluorometer. Peak wavelengths of the excitation spectra and peak wavelengths of the emission spectra are shown in Table 9. According to Table 9, the phosphor of the present invention was found to be excited with light having a wavelength of 295 nm to 540 nm so as to emit light of a blue color to a red color. For example, according to Examples in which the inorganic crystal includes Eu as the M element, and the A element is Sr or a combination of Sr and Ba, the phosphor of the present invention was found to be excited mainly with ultraviolet light having a wavelength of 295 nm to 380 nm or purple light of 380 nm to 420 nm so as to emit light of a blue color to a blue-green color with high brightness, and, in particular, the phosphor was found to emit light of a blue color of 440 nm or more to 520 nm or less with high brightness only by controlling the composition.

TABLE 9

Excitation Emission Characteristics in Examples and Comparative Examples of Phosphor Synthesis
Excitation emission characteristics in examples and comparative examples of phosphor synthesis

| Example | Excitation spectrum Peak wavelength (nm) | Emission spectrum Peak wavelength (nm) | Intensity Arbitrary unit |
|---|---|---|---|
| Comparative example 1 | | | 0.00 |
| Example 2 | 343 | 467 | 0.96 |
| Example 3 | 344 | 473 | 1.08 |
| Example 4 | 371 | 574 | 0.05 |
| Example 5 | 400 | 563 | 0.26 |
| Example 6 | 342 | 465 | 1.06 |
| Example 7 | 344 | 471 | 1.57 |
| Example 8 | 336 | 487 | 0.56 |
| Example 9 | 351 | 475 | 0.56 |
| Example 10 | 344 | 478 | 0.78 |
| Example 11 | 340 | 411 | 0.43 |
| Example 12 | 274 | 635 | 0.03 |
| Example 13 | 441 | 793 | 0.14 |
| Example 14 | 441 | 793 | 0.03 |
| Example 15 | 254 | 542 | 0.19 |
| Example 16 | 537 | 784 | 0.03 |

TABLE 9-continued

Excitation Emission Characteristics in Examples and Comparative Examples of Phosphor Synthesis
Excitation emission characteristics in examples and comparative examples of phosphor synthesis

| Example | Excitation spectrum Peak wavelength (nm) | Emission spectrum Peak wavelength (nm) | Intensity Arbitrary unit |
|---|---|---|---|
| Example 17 | 434 | 796 | 0.04 |
| Example 18 | 254 | 585 | 0.08 |
| Example 19 | 343 | 466 | 0.83 |
| Example 20 | 341 | 468 | 0.98 |
| Example 21 | 343 | 472 | 1.16 |
| Example 22 | 340 | 457 | 0.95 |
| Example 23 | 298 | 439 | 0.59 |
| Example 24 | 346 | 476 | 1.28 |
| Example 25 | 372 | 479 | 1.24 |
| Example 26 | 344 | 475 | 0.64 |
| Example 27 | 344 | 472 | 1.01 |
| Example 28 | 341 | 466 | 0.93 |
| Example 29 | 340 | 465 | 1.09 |
| Example 30 | 342 | 463 | 1.18 |
| Example 31 | 345 | 465 | 1.17 |
| Example 32 | 347 | 463 | 1.33 |
| Example 33 | 393 | 563 | 0.12 |
| Example 34 | 299 | 522 | 0.38 |
| Example 35 | 295 | 522 | 0.21 |
| Example 36 | 343 | 478 | 0.40 |
| Example 37 | 346 | 473 | 1.22 |
| Example 38 | 343 | 472 | 0.92 |
| Example 39 | 299 | 465 | 0.45 |
| Example 40 | 369 | 586 | 0.19 |
| Example 41 | 349 | 472 | 1.49 |
| Example 42 | 338 | 455 | 1.04 |
| Example 43 | 294 | 436 | 0.64 |
| Example 44 | 357 | 474 | 1.55 |
| Example 45 | 361 | 479 | 1.41 |
| Example 46 | 344 | 473 | 1.05 |
| Example 47 | 345 | 472 | 1.28 |
| Example 48 | 343 | 467 | 1.11 |
| Example 49 | 340 | 464 | 1.42 |
| Example 50 | 341 | 463 | 1.31 |
| Example 51 | 344 | 464 | 1.18 |
| Example 52 | 343 | 462 | 1.49 |
| Example 53 | 440 | 573 | 0.16 |
| Example 54 | 298 | 523 | 0.43 |
| Example 55 | 298 | 519 | 0.32 |
| Example 56 | 371 | 477 | 0.51 |
| Example 57 | 343 | 471 | 1.29 |
| Example 58 | 343 | 467 | 1.06 |
| Example 59 | 296 | 467 | 0.43 |
| Example 60 | 350 | 586 | 0.16 |
| Example 61 | 341 | 479 | 0.59 |
| Example 62 | 341 | 477 | 0.93 |
| Example 63 | 341 | 479 | 0.98 |
| Example 64 | 338 | 478 | 1.16 |
| Example 65 | 331 | 479 | 1.19 |
| Example 66 | 342 | 479 | 1.19 |

Examples of Light-Emitting Unit and Image Display Device; Examples 67 to 70

Next, a light-emitting unit utilizing the phosphor of the present invention will be described.

Example 67

Figure 19:
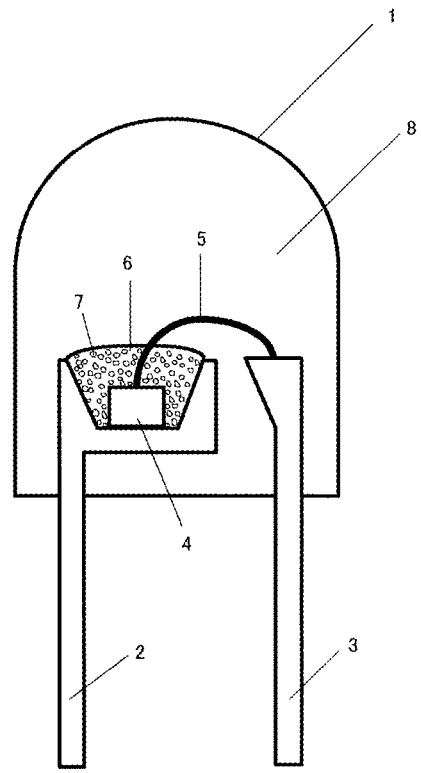
FIG. 19 is a schematic diagram showing an illuminating device (bullet-type of LED illuminating device) according to the present invention.

FIG. 19 is a schematic diagram showing an illuminating device (bullet-type of LED illuminating device) according to the present invention.

A so-called bullet-type white light-emitting diode lamp (1) as shown in FIG. 19 was produced. There are two lead wires (2, 3), one of which (2) has a recess, in which a blue light-emitting diode element (4) having an emission peak of 365 nm is placed. The lower electrode of the ultraviolet light-emitting diode element (4) and the bottom surface of the recess are electrically connected with conductive paste, and the upper electrode and the other lead wire (3) are electrically connected through a gold thin wire (5). The phosphor (7) is dispersed in resin and mounted in the vicinity of the light-emitting diode element (4). The first resin (6) in which this phosphor is dispersed is transparent, and covers the entire ultraviolet light-emitting diode element (4). The tip-top portion of the lead wire including the recess, the blue light-emitting diode element, and the first resin in which the phosphor is dispersed are sealed with transparent second resin (8). A second resin (8) which is transparent is formed approximately in a cylindrical shape as a whole and the top portion is rounded in a lens shape such that the lamp is generally referred to as a bullet-type.

In the present embodiment, the first resin (6) was formed to have phosphors dispersed by dropping an appropriate amount of a mixture of blended phosphors and resin with a dispenser, the mixture was prepared by mixing the blended phosphors with epoxy resin by the concentration of 37 wt %, and the blended phosphors were prepared by blending the phosphor in powder prepared for Example 21 and a yellow phosphor of α-sialon:Eu in powder with the ratio by weight of 7 to 3. The light emitted by the thus-obtained light-emitting unit had an emission color of white and characterized by x=0.33 and y=0.33 in the color coordinates.

Example 68

Figure 20:
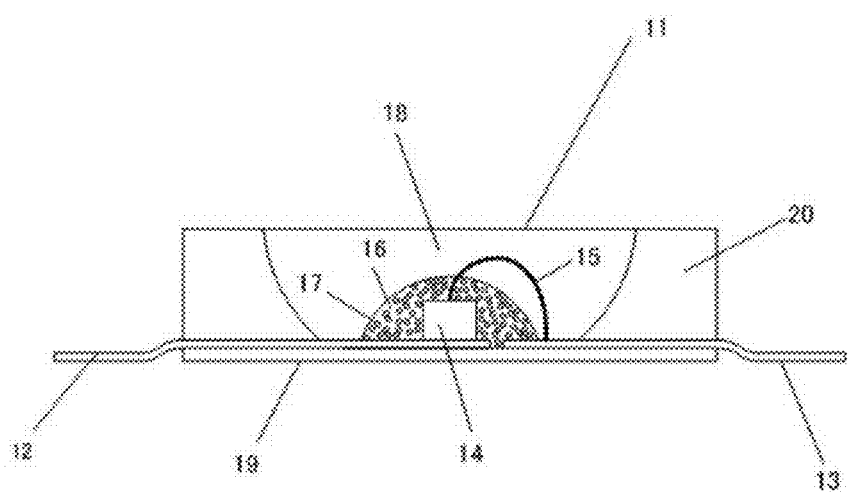
FIG. 20 is a schematic diagram showing an illuminating device (board-mounting-type LED illuminating device) according to the present invention.

FIG. 20 is a schematic diagram showing an illuminating device (board-mounting-type LED illuminating device) according to the present invention.

A chip-type white light-emitting diode lamp (11) for board-mounting as shown in FIG. 20 was produced. Two lead wires (12, 13) are fixed to a white alumina ceramic board (19) having high reflectance of visible light and one end of each of the wires is located at approximately the center portion of the board and the other end of each of the wires extends outside to serve as an electrode to be soldered when the lamp is mounted on the electric board. One (12) of the lead wires has the one end on which an ultraviolet light-emitting diode element (14) having an emission peak wavelength of 365 nm is place and fixed thereto such that the element is located at the center of the board. The lower electrode of the ultraviolet light-emitting diode element (14) and the lead wire beneath the element are electrically connected with conductive paste, and the upper electrode and the other lead wire (13) are electrically connected through a gold thin wire (15).

A material prepared by mixing the first resin (16) and a blended phosphor (17) prepared by blending the phosphor prepared for Example 21 and a yellow phosphor of α-sialon: Eu with the ratio by weight of 7 to 3 is mounted in the vicinity of the light-emitting diode element. The first resin in which this phosphor is dispersed is transparent, and covers the entire ultraviolet light-emitting diode element (14). Also, a wall surface member (20) having a hole opened at the center portion is fixed to the ceramic board. The wall surface member (20) has the center portion formed as the hole in which the ultraviolet light-emitting diode element (14) and the resin (16) having the phosphor (17) dispersed therein are contained and the portion of the hole facing the center is made to be a slope. This slope is a reflective surface for taking out light forward, and the shape of the curved surface of the slope is determined in consideration of the direction of light reflection. Further, at least the surface which constitutes the reflective surface forms a surface having high visible light reflectance with white color or metallic luster. In the present example, the wall surface member (20) is configured with white silicone resin. The hole at the center portion of the wall surface member is formed with a recess as the final shape of the chip-type light emitting diode lamp, and is filled up with second transparent resin (18) to seal all of the ultraviolet light-emitting diode element (14) and the first resin (16) in which the phosphor (17) is dispersed. In the present example, the same epoxy resin was used for both the first resin (16) and second resin (18). The addition percentage of the phosphor, the achieved chromaticity, and the like are approximately identical to those in Example 67.

Next, a design example of an image display device using the phosphor of the present invention is described.

Example 69

Figure 21:
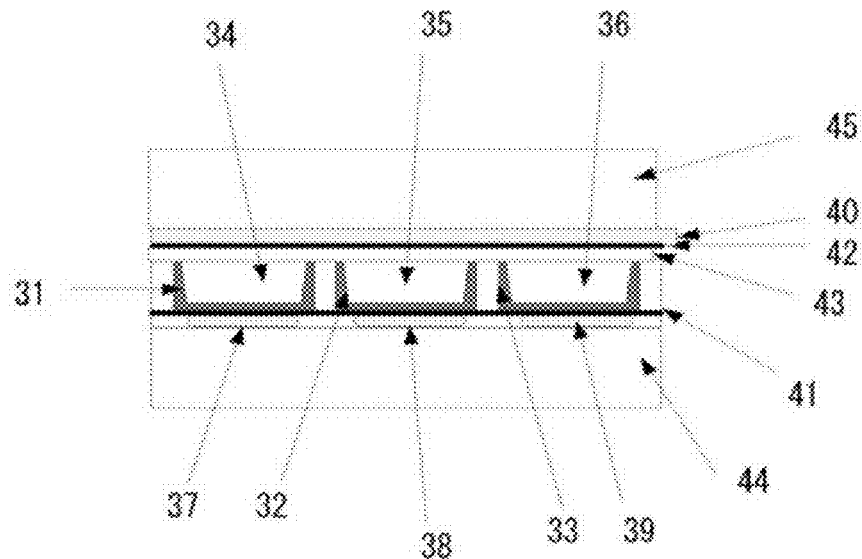
FIG. 21 is a schematic diagram showing an image display device (plasma display panel) according to the present invention.

FIG. 21 is a schematic diagram showing an image display device (plasma display panel) according to the present invention.

A red phosphor ($CaAlSiN_3:Eu^2$)(31), a green phosphor (β-sialon:$Eu^{2+}$)(32), and the blue phosphor (33) of Example 21 according to the present invention are applied to inner surfaces of the respective cells (34, 35, 36), which are arranged via electrodes (37, 38, 39) and a dielectric layer (41) over a glass board (44). If electric power is supplied to the electrodes (37, 38, 39, 40), a vacuum ultraviolet ray is generated by Xe discharge in each of the cells, thereby exciting the respective phosphors so as to emit visible light of a red color, a green color, or a blue color such that the emitted light may be observed from the outside through a protective layer (43), a dielectric layer (42), and a glass board (45) so as to serve as an image display.

Example 70

Figure 22:
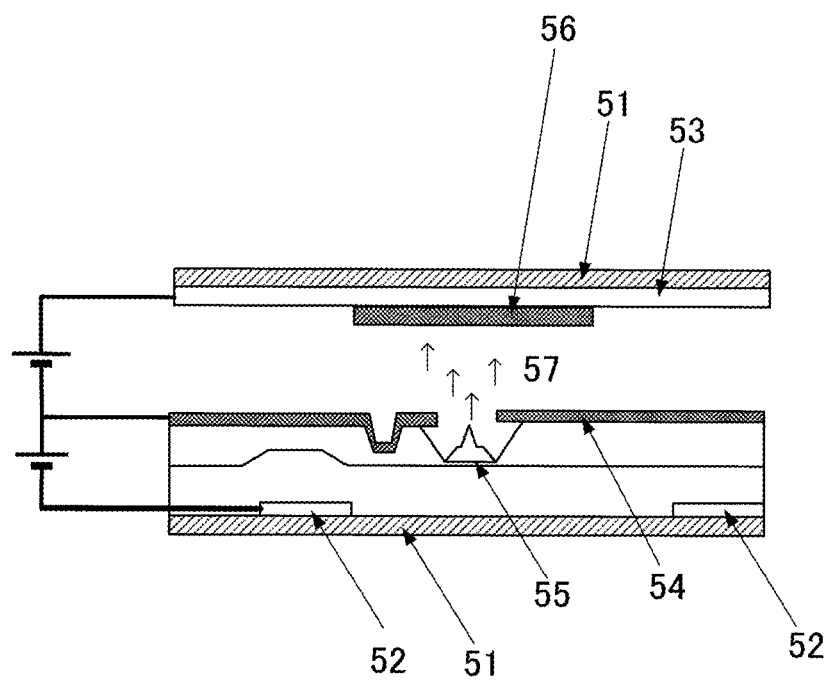
FIG. 22 is a schematic diagram showing an image display device (field emission display panel) according to the present invention.

FIG. 22 is a schematic diagram showing an image display device (field emission display panel) according to the present invention.

The blue phosphor (56) of Example 30 of the present invention is applied to an interior surface of an anode (53). By applying a voltage between a cathode (52) and a gate (54), electrons (57) are emitted from an emitter (55). The electrons are accelerated by the voltage between the anode (53) and cathode (52), and impinge on the blue phosphor (56) to excite the phosphor to emit light. The entire device is protected by a glass (51). Although the drawing shows a single light emission cell comprising one emitter and one phosphor, a display is actually configured to emit light of a variety of color by arranging many cells for a green color and a red color in addition to for the blue color. Although the phosphors to be used for cells of a green color and a red color are not particularly specified, a phosphor which shows high brightness under a low speed electron beam is preferable.

The nitride phosphor of the present invention has different emission characteristics (emission color and excitation characteristics, emission spectrum) from those of the conventional phosphor, exhibits high emission intensity in the case where it is combined with a LED of 470 nm or less, is chemically and thermally stable, and further has little degradation in the intensity of the phosphor when it is exposed to the excitation source such that it is a nitride phosphor to be used suitably for the VFD, the FED, the PDP, the CRT, and the white LED. It is expected that the phosphor of the present invention will be utilized in material design in various kinds of display devices so as to contribute to the development of the industry.

What is claimed is:

1. A phosphor comprising: an inorganic compound comprising:
   an inorganic crystal constituted of a crystal represented by $Sr_1Si_3Al_2O_4N_4$ and an M element being solid-solved into the inorganic crystal, wherein M is one or more kinds of elements selected from a group consisting of Mn, Ce, Pr, Nd, Sm, Eu, Tb, Dy, and Yb; or
   another inorganic crystal represented by $A_1(D,E)_5X_8$ and having a same crystal structure as the crystal represented by the $Sr_1Si_3Al_2O_4N_4$, and the M element being solid-solved into the another inorganic crystal, wherein A is one or more kinds of elements selected from the group consisting of Mg, Ca, Sr, and Ba, D is one or more kinds of elements selected from the group consisting of Si, Ge, Sn, Ti, Zr, and Hf, E is one or more kinds of elements selected from the group consisting of B, Al, Ga, In, Sc, Y, and La, and X is one or more kinds of elements selected from the group consisting of O, N, and F; or
   a solid-solution crystal of the inorganic crystal or the another inorganic crystal.

2. The phosphor according to claim 1,
wherein the another inorganic crystal is a crystal represented by $A_1Si_3Al_2O_4N_4$.

3. The phosphor according to claim 2,
wherein the A element includes either or both of Sr and Ba, the D element includes Si, the E element includes Al, the X element includes N, and the X element further includes O if necessary.

4. The phosphor according to claim 1,
wherein the M element includes Eu.

5. The phosphor according to claim 1,
wherein the inorganic crystal is a crystal in a monoclinic system.

6. The phosphor according to claim 1,
wherein the inorganic crystal is a crystal in a monoclinic system and has a symmetry in a space group $P2_1$, and lattice constants a, b, and c have values in following ranges:

$a=0.72516\pm0.05$ nm;

$b=0.93431\pm0.05$ nm; and $c=1.08761\pm0.05$ nm, and wherein "±0.05" is a tolerance.

7. The phosphor according to claim 1,
wherein the another inorganic crystal is $Ba_1Si_3Al_2O_4N_4$ or $(Sr,Ba)_1Si_3Al_2O_4N_4$.

8. The phosphor according to claim 1,
wherein the another inorganic crystal is represented by a composition formula:

$(Sr,Ba)_1Si_{3-x}Al_{2+x}O_{4+x}N_{4-x}$, wherein $-1\le x\le 2$.

9. The phosphor according to claim 1,
wherein the inorganic compound consists of a crystal represented by:

$A_1Si_{3-x}Al_{2+x}O_{4+x}N_{4-x}$, wherein $-1\le x\le 2$, and Eu is solid-solved therein.

10. The phosphor according to claim 9,
wherein the A element is a combination of Sr and Ba.

11. The phosphor according to claim 10,
wherein the inorganic crystal is represented, using parameters x and y, by:

$Eu_y(Sr,Ba)_1Si_{3-x}Al_{2+x}O_{4+x}N_{4-x}$ wherein $-1\le x\le 2$, and $0.0001\le y\le 0.5$.

12. The phosphor according to claim 9,
wherein the x is equal to 0.

13. The phosphor according to claim 9, wherein:
the A element is a combination of Sr and Ba,
the x is equal to 0, and
fluorescence of a blue color having 440 nm or more to 520 nm or less is emitted upon irradiation of light having 295 to 420 nm.

14. The phosphor according to claim 1,
wherein the inorganic compound includes a single crystal particle or an aggregate thereof having a mean particle diameter of 0.1 μm or more to 20 μm or less.

15. The phosphor according to claim 1,
wherein a sum of Fe, Co, and Ni impurity elements does not exceed 500 ppm.

16. The phosphor according to claim 1, further comprising an amorphous phase or a crystal phase that is different from the inorganic compound in addition to the inorganic compound,
wherein a content amount of the inorganic compound is equal to or more than 20 mass %.

17. The phosphor according to claim 16,
wherein the amorphous phase or the crystal phase that is different from the inorganic compound is an inorganic substance having electronic conductivity.

18. The phosphor according to claim 17,
wherein the inorganic substance having the electrical conductivity is oxide, oxynitride, nitride, or a combination thereof, any one of which includes one or two or more kinds of elements selected from a group consisting of Zn, Al, Ga, In, and Sn.

19. The phosphor according to claim 16,
wherein the amorphous phase or the crystal phase that is different from the inorganic compound is another phosphor.

20. The phosphor according to claim 1,
wherein the phosphor emits fluorescent having a peak in a wavelength range of 440 nm to 520 nm upon irradiation of an excitation source.

21. The phosphor according to claim 20,
wherein the excitation source is a vacuum ultraviolet ray, an ultraviolet ray, or visible light, each of which has a wavelength that is in each specific range among from 100 nm to 420 nm, or an electron beam or an X-ray.

22. The phosphor according to claim 1,
wherein a color of light emitted upon irradiation of an excitation source satisfies, in terms of values of (x, y) of CIE 1931 chromaticity coordinates, conditions:

$0.05\le x\le 0.3$; and $0.02\le y\le 0.4$.

23. A method of manufacturing a phosphor, the method comprising: the step of
firing a mixture of raw material in a temperature range of 1,200° C. or higher to 2,200° C. or lower in an inert atmosphere including nitrogen;
wherein the phosphor comprises: an inorganic compound comprising:
an inorganic crystal constituted of a crystal represented by $Sr_1Si_3Al_2O_4N_4$ and an M element being solid-solved into the inorganic crystal, wherein M is one or more kinds of elements selected from a group consisting of Mn, Ce, Pr, Nd, Sm, Eu, Tb, Dy, and Yb; or another inorganic crystal represented by $A_1(D,E)_5X_8$ and having a same crystal structure as the crystal represented by the $Sr_1Si_3Al_2O_4N_4$, and the M element being solid-solved into the another inorganic crystal, wherein A is one or more kinds of elements selected from the group consisting of Mg, Ca, Sr, and Ba, D is one or more kinds of elements selected from the group consisting of Si, Ge, Sn, Ti, Zr, and Hf, E is one or more kinds of elements selected from the group consisting of B, Al, Ga, In, Sc, Y, and La, and X is one or more kinds of elements selected from the group consisting of O, N, and F; or a solid-solution crystal of the inorganic crystal or the another inorganic crystal.

24. The method of manufacturing the phosphor according to claim 23,
wherein the mixture of raw material includes at least nitride or oxide of europium; nitride, oxide, or carbonate of strontium and/or nitride, oxide, or carbonate of barium; silicon oxide or silicon nitride; and aluminum oxide or aluminum nitride.

25. The method of manufacturing the phosphor according to claim 23, wherein the inert atmosphere including nitrogen is a nitrogen gas atmosphere in a pressure range of 0.1 MPa or higher to 100 MPa or lower.

26. The method of manufacturing the phosphor according to claim 23,
wherein the step of firing is performed after the raw material in a form of powder or aggregate are filled in a container as being maintained with a filling rate of 40% or less in a bulk density.

27. The method of manufacturing the phosphor according to claim 23,
wherein a mean particle diameter of powder particles or aggregates of the raw material is 500 μm or less.

28. The method of manufacturing the phosphor according to claim 23,
wherein a mean particle diameter of aggregates of the raw material is controlled to be 500 μm or less by means of a spray dryer, sieving or pneumatic classification.

29. The method of manufacturing the phosphor according to claim 23, wherein the step of firing is performed by a pressureless sintering method or a gas-pressure sintering method.

30. The method of manufacturing the phosphor according to claim 23,
wherein a mean particle diameter of phosphor powder synthesized by firing is controlled to be from 50 nm or more and 200 μm or less by at least one technique selected from pulverization, classification, and acid treatment.

31. The method of manufacturing the phosphor according to claim 23,
wherein a phosphor powder after firing, a phosphor powder after pulverization treatment, or a phosphor powder after particle size adjustment is heat-treated at a temperature that is equal to or higher than 1,000° C. and equal to or lower than a firing temperature.

32. The method of manufacturing the phosphor according to claim 23,
wherein another inorganic compound to produce a liquid phase at a temperature equal to or less than the firing temperature is added to the mixture of raw material, which is then fired in the firing step.

33. The method of manufacturing the phosphor according to claim 32,
wherein the another inorganic compound to produce the liquid phase at the temperature equal to or less than the firing temperature is a mixture of one or more kinds of substances selected from a group consisting of fluoride, chloride, iodide, bromide, and phosphate of one or more elements selected from a group consisting of Li, Na, K, Mg, Ca, Sr, and Ba.

34. The method of manufacturing the phosphor according to claim 32,
wherein a content amount of the another inorganic compound to produce the liquid phase at the temperature equal to or less than the firing temperature is reduced by washing with a solvent after the step of firing.

35. A light-emitting unit comprising a light-emitting body and a first phosphor,
wherein the first phosphor is the phosphor recited in claim 1.

36. The light-emitting unit according to claim 35,
wherein the light-emitting body is an organic EL light-emitting body (OLED), a semiconductor laser, a laser diode (LD), or a light-emitting diode (LED) emitting light of a wavelength of 330 to 500 nm.

37. The light-emitting unit according to claim 35,
wherein the light-emitting unit is a white light-emitting diode, an illuminating device including a plurality of white light-emitting diodes, or a backlight for a liquid crystal panel.

38. The light-emitting unit according to claim 35, further comprising a second phosphor, wherein:
the light-emitting body emits ultraviolet or visible light having a peak wavelength of 300 to 420 nm, and
the light-emitting unit emits white light or light other than the white light by mixing blue light emitted from the first phosphor and light having a wavelength of 470 nm or more emitted from the second phosphor.

39. The light-emitting unit according to claim 35, further comprising a blue phosphor being caused to emit light having a peak wavelength of 420 nm to 500 nm or less by the light-emitting body.

40. The light-emitting unit according to claim 39,
wherein the blue phosphor is selected from a group consisting of AlN: (Eu, Si), $BaMgAl_{10}O_{17}$:Eu, $SrSi_9AL_{19}ON_{31}$:Eu, $LaSi_9Al_{19}N_{32}$:Eu, α-sialon:Ce, and JEM:Ce.

41. The light-emitting unit according to claim 35, further comprising a green phosphor being caused to emit light having a peak wavelength of 500 nm or more to 550 nm or less by the light-emitting body.

42. The light-emitting unit according to claim 41,
wherein the green phosphor is selected from a group consisting of β-sialon:Eu, (Ba, Sr, Ca, Mg)$_2$SiO$_4$:Eu, and (Ca, Sr, Ba) Si$_2$O$_2$N$_2$:Eu.

43. The light-emitting unit according to claim 35, further comprising a yellow phosphor being caused to emit light having a peak wavelength of 550 nm or more to 600 nm or less by the light-emitting body.

44. The light-emitting unit according to claim 43,
wherein the yellow phosphor is selected from a group consisting of YAG:Ce, α-sialon:Eu, CaAlSiN$_3$:Ce, and La$_3$Si$_6$N$_{11}$:Ce.

45. The light-emitting unit according to claim 35, further comprising a red phosphor being caused to emit light having a peak wavelength of 600 nm or more to 700 nm or less by the light-emitting body.

46. The light-emitting unit according to claim 45,
wherein the red phosphor is selected from a group consisting of $CaAlSiN_3$:Eu, $(Ca, Sr)AlSiN_3$:Eu, $Ca_2Si_5N_8$:Eu, and $Sr_2Si_5N_8$:Eu.

47. The light-emitting unit according to claim 35,
wherein the light-emitting body is an LED for emitting light having a wavelength of 320 to 420 nm.

48. An image display device comprising: an excitation source and a phosphor,
wherein the phosphor comprises at least the phosphor recited in claim 1.

49. The image display device according to claim 48,
wherein the image display device is a fluorescent display tube (VFD), a field emission display (FED), a plasma display panel (PDP), a cathode-ray tube (CRT), or a liquid crystal display (LCD).

50. A pigment comprising the phosphor recited in claim 1.

51. An ultraviolet absorber comprising the phosphor recited in claim 1.

* * * * *